(12) United States Patent
Im

(10) Patent No.: US 7,259,081 B2
(45) Date of Patent: Aug. 21, 2007

(54) PROCESS AND SYSTEM FOR LASER CRYSTALLIZATION PROCESSING OF FILM REGIONS ON A SUBSTRATE TO PROVIDE SUBSTANTIAL UNIFORMITY, AND A STRUCTURE OF SUCH FILM REGIONS

(76) Inventor: James S. Im, 520 W. 114th St., Apt 74, New York, NY (US) 10027

( * ) Notice: Subject to any disclaimer, the term of this patent is extended or adjusted under 35 U.S.C. 154(b) by 365 days.

(21) Appl. No.: 10/525,288

(22) PCT Filed: Aug. 19, 2003

(86) PCT No.: PCT/US03/25946

§ 371 (c)(1),
(2), (4) Date: Feb. 16, 2005

(87) PCT Pub. No.: WO2004/017379

PCT Pub. Date: Feb. 26, 2004

(65) Prior Publication Data

US 2005/0202654 A1     Sep. 15, 2005

Related U.S. Application Data

(60) Provisional application No. 60/405,084, filed on Aug. 19, 2002.

(51) Int. Cl.
*H01L 21/20* (2006.01)
(52) U.S. Cl. .................. 438/487; 438/166; 438/488; 438/489
(58) Field of Classification Search .............. 438/487
See application file for complete search history.

(56) References Cited

U.S. PATENT DOCUMENTS 3,632,205 A     1/1972   Marcy (Continued)

FOREIGN PATENT DOCUMENTS

EP     681316     8/1995

(Continued)

OTHER PUBLICATIONS

Im et al., "Controlled Super-Lateral Growth of Si Films for Microstructural Manipulation and Optimization", Phys. Stat Sol. (a), vol. 166, p. 603 (1998).

(Continued)

*Primary Examiner*—Carl Whitehead, Jr.
*Assistant Examiner*—Colleen E. Rodgers
(74) *Attorney, Agent, or Firm*—Baker Botts LLP

(57) ABSTRACT

A process and system for processing a thin film sample (e.g., a semiconductor thin film), as well as the thin film structure are provided. In particular, a beam generator can be controlled to emit at least one beam pulse. With this beam pulse, at least one portion of the film sample is irradiated with sufficient intensity to fully melt such section of the sample throughout its thickness, and the beam pulse having a predetermined shape. This portion of the film sample is allowed to resolidify, and the re-solidified at least one portion is composed of a first area and a second area. Upon the re-solidification thereof, the first area includes large grains, and the second area has a region formed through nucleation. The first area surrounds the second area and has a grain structure which is different from a grain structure of the second area. The second area is configured to facilitate thereon an active region of an electronic device.

104 Claims, 13 Drawing Sheets

U.S. PATENT DOCUMENTS

| | | |
|---|---|---|
| 4,234,358 A | 11/1980 | Celler et al. |
| 4,309,225 A | 1/1982 | Fan et al. |
| 4,382,658 A | 5/1983 | Shields et al. |
| 4,456,371 A | 6/1984 | Lin |
| 4,639,277 A | 1/1987 | Hawkins |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Suguhara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,453,594 A | 9/1995 | Konecny |
| 5,456,763 A | 10/1995 | Kaschmitter et al. |
| 5,496,768 A | 3/1996 | Kudo |
| 5,523,193 A | 6/1996 | Nelson |
| 5,529,951 A | 6/1996 | Noguchi et al. |
| 5,591,668 A | 1/1997 | Maegawa et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,844,588 A | 12/1998 | Anderson |
| 5,861,991 A | 1/1999 | Fork |
| 5,893,990 A | 4/1999 | Tanaka |
| 5,986,807 A | 11/1999 | Fork |
| 6,014,944 A | 1/2000 | Aklufi et al. |
| 6,072,631 A | 6/2000 | Guenther et al. |
| 6,081,381 A | 6/2000 | Shalapenok et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,177,301 B1 | 1/2001 | Jung |
| 6,187,088 B1 | 2/2001 | Okumura |
| 6,190,985 B1 | 2/2001 | Buynoski |
| 6,193,796 B1 | 2/2001 | Yang |
| 6,203,952 B1 | 3/2001 | O'Brien et al. |
| 6,235,614 B1 | 5/2001 | Yang |
| 6,242,291 B1 | 6/2001 | Kusumoto et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,186 B1 | 12/2001 | Kirk et al. |
| 6,326,286 B1 | 12/2001 | Park et al. |
| 6,333,232 B1 | 12/2001 | Kunikiyo |
| 6,368,945 B1 | 4/2002 | Im |
| 6,388,146 B1 | 5/2002 | Onishi et al. |
| 6,407,012 B1 | 6/2002 | Miyasaka et al. |
| 6,444,506 B1 | 9/2002 | Kusumoto et al. |
| 6,468,845 B1 | 10/2002 | Nakajima et al. |
| 6,495,067 B1 | 12/2002 | Ono |
| 6,511,718 B1 | 1/2003 | Paz de Araujo et al. |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,555,449 B1 | 4/2003 | Im et al. |
| 6,563,077 B2 | 5/2003 | Im |
| 6,573,531 B1 | 6/2003 | Im et al. |
| 6,582,827 B1 | 6/2003 | Im |
| 6,621,044 B2 | 9/2003 | Jain et al. |
| 6,635,554 B1 | 10/2003 | Im et al. |
| 6,830,993 B1 | 12/2004 | Im et al. |
| 2001/0001745 A1 | 5/2001 | Im et al. |
| 2001/0041426 A1 | 11/2001 | Im |
| 2002/0104750 A1 | 8/2002 | Ito |
| 2003/0029212 A1 | 2/2003 | Im |
| 2003/0096489 A1 | 5/2003 | Im et al. |
| 2003/0119286 A1 | 6/2003 | Im et al. |
| 2004/0053450 A1 | 3/2004 | Sposili et al. |
| 2004/0061843 A1 | 4/2004 | Im |
| 2005/0032249 A1 | 2/2005 | Im et al. |
| 2005/0034653 A1 | 2/2005 | Im et al. |

FOREIGN PATENT DOCUMENTS

| | | |
|---|---|---|
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 04033327 | 2/1992 |
| JP | 6252048 | 9/1994 |
| JP | 6283422 | 10/1994 |
| JP | 7176757 | 7/1995 |
| JP | 11064883 | 3/1999 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | 02031869 | 4/2002 |
| WO | 0242847 | 5/2002 |
| WO | 02086954 | 10/2002 |
| WO | 02086955 | 10/2002 |
| WO | 03018882 | 3/2003 |
| WO | 03046965 | 6/2003 |
| WO | 04075263 | 8/2003 |
| WO | 03084688 | 10/2003 |
| WO | 04017379 | 2/2004 |
| WO | 04017380 | 2/2004 |
| WO | 04017381 | 2/2004 |
| WO | 04017382 | 2/2004 |

OTHER PUBLICATIONS

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69(19), p. 2864 (1996).*

Crowder et al., "Low-Temperature Single-Crystal Si TFT's Fabricated on Si Films processed via Sequential Lateral Solidification", IEEE Electron Device Letter, vol. 19 (8), p. 306 (1998).*

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.*

C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH. 1999.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions as Width Transitions on interconnect reliabity," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., Vol. 64 (17), p. 2303 (1994).

Brochure from MicroLas Lasersystem, GmbH, "UV Optics Systems for Excimer Laser Based Micromaching and Marking". 1999.

Ishida et al., "Ultra-shallow boxlike profiles fabricated by pulsed ultraviolet-laser doping process", J. Vac. Sci. Technol. B 12(1), p. 399-403, 1994. (No month).

Yoshimoto, et al., "Excimer-Laser-Produced and Two-Dimensionally Position-Controlled Giant Si Grains on Organic SOG Underlayer", p. 285-286, AM-LCD 2000. No month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.

I.W. Boyd, Laser Processing of Thin Films and Microstructures, Oxidation, Deposition, and Etching of Insulators (Springer—Verlag Berlin Heidelber 1987).*

N. Yamauchi and R. Reif, Journal of Applied Physics, "Polycrystalline silicon thin films processed with silicon ion implantation and subsequent solid-phase crystallization: Theory, experiments, and thin-film transistor applications"—Apr. 1, 1994—vol. 75, Issue 7, pp. 3235-3257.

T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.*

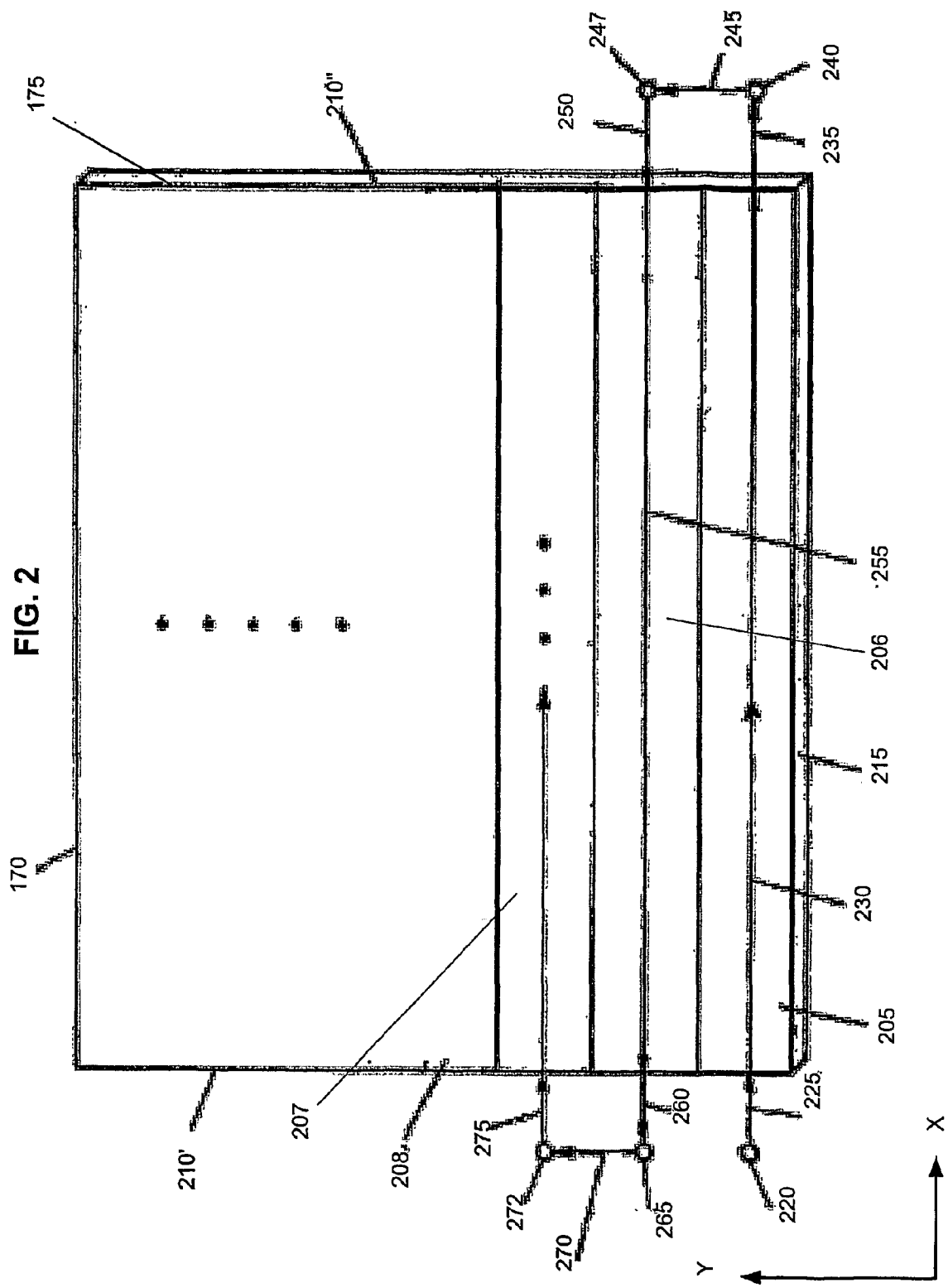

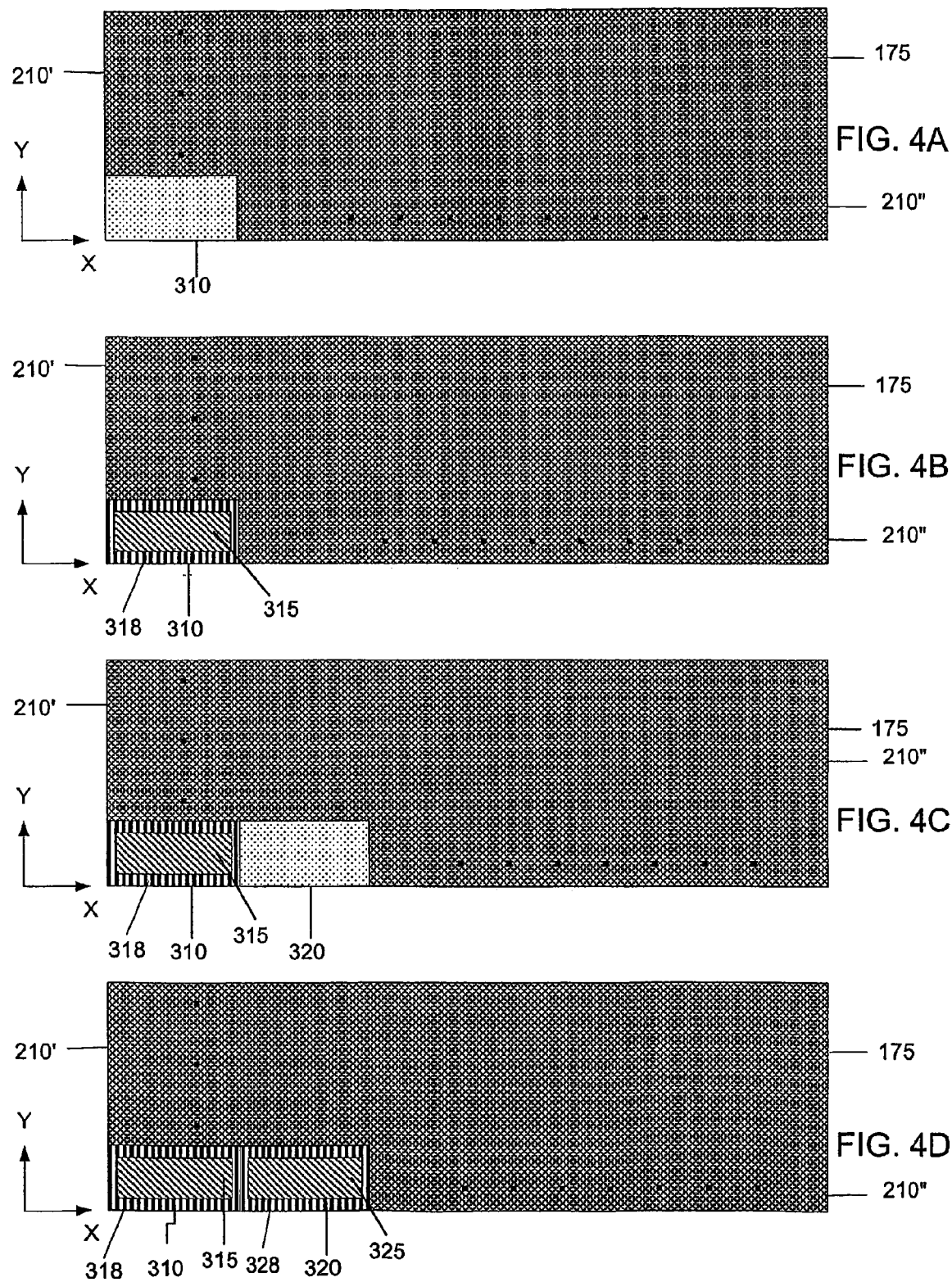

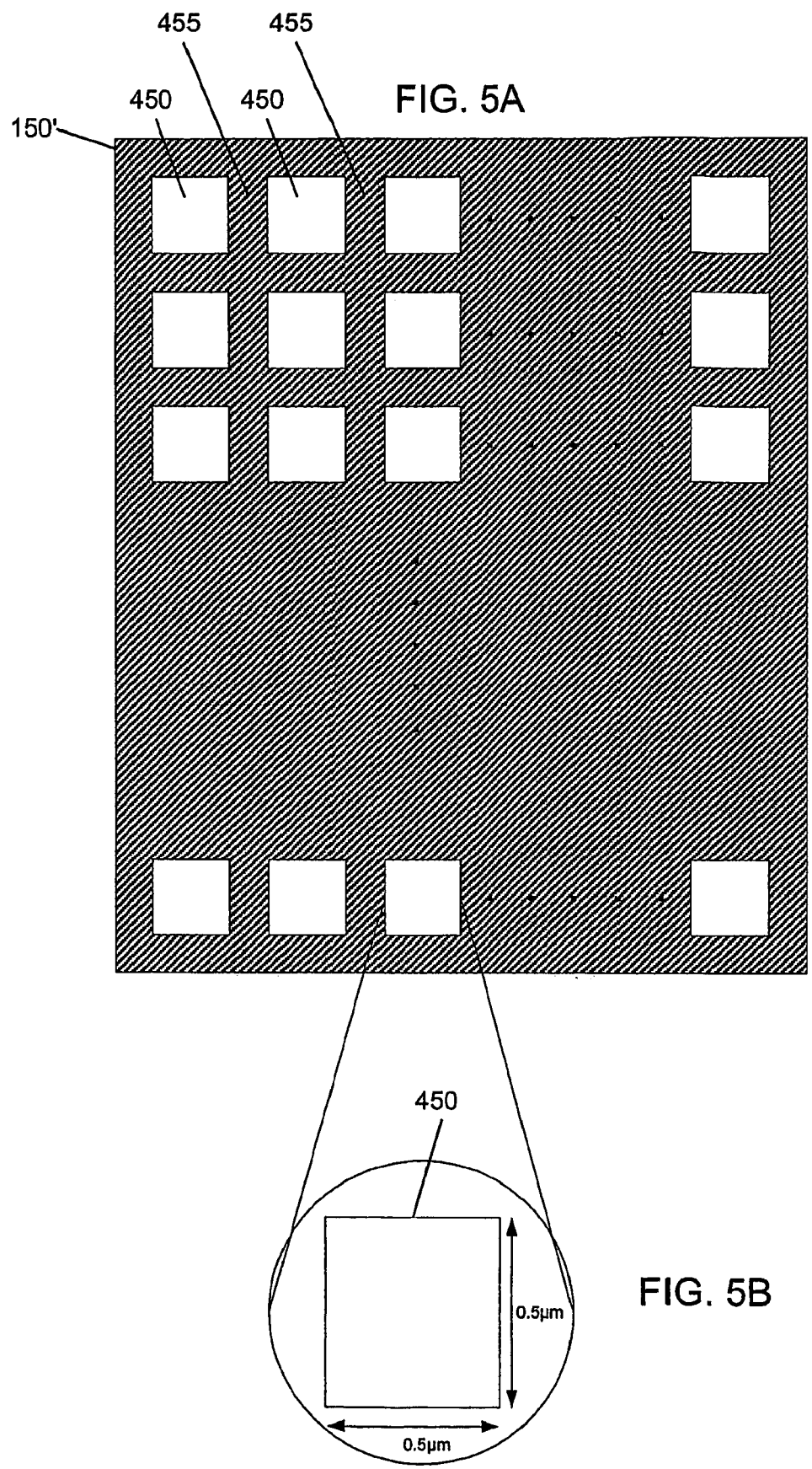

PROCESS AND SYSTEM FOR LASER CRYSTALLIZATION PROCESSING OF FILM REGIONS ON A SUBSTRATE TO PROVIDE SUBSTANTIAL UNIFORMITY, AND A STRUCTURE OF SUCH FILM REGIONS

RELATED APPLICATION

This application is a national phase of Internation Patent Application No. PCT/US03/025946, filed Aug. 19, 2003, published on Feb. 26, 2004 as International Patent Publication No. WO 04/017379, which claims priority from United States Provisional Application No. 60/405,084, which was filed on Aug. 19, 2002, each of which are incorporated by reference in their entireties herein, and from which priority is claimed.

NOTICE OF GOVERNMENT RIGHTS

The U.S. Government may have certain rights in this invention pursuant to the terms of the Defense Advanced Research Project Agency award number N66001-98-1-8913.

FIELD OF THE INVENTION

The present invention relates to techniques for processing of films, and more particularly to techniques for processing films to obtain a substantially uniform grain region for placing at least an active region of a thin-film transistor ("TFT") therein.

BACKGROUND OF THE INVENTION

Semiconductor films, such as silicon films, are known to be used for providing pixels for liquid crystal display devices. Such films have previously been processed (i.e., irradiated by an excimer laser and then crystallized) via excimer laser annealing ("ELA") methods. However, the semiconductor films processed using such known ELA methods often suffer from microstructural non-uniformities, which manifest themselves in availing a non-uniform performance of thin-film transistor ("TFT") devices fabricated on such films. The non-uniformity generally stems from the intrinsic pulse-to-pulse variations in the output energy of the excimer lasers irradiating the semiconductor films. The above-described non-uniformity could manifest itself in, for example, a noticeable difference in a brightness level of the pixels in one area of the display as compared to the brightness in other areas thereof.

Significant effort has gone into the refinement of "conventional" ELA (also known as line-beam ELA) processes in the attempt to reduce or eliminate the non-uniformity. For example, U.S. Pat. No. 5,766,989 issued to Maegawa et al., the entire disclosure of which is incorporated herein in its entirety by reference, describes the ELA methods for forming polycrystalline thin film and a method for fabricating a thin-film transistor. This publication attempts to address the problem of non-uniformity of characteristics across the substrate, and provide certain options for apparently suppressing such non-uniformities.

However, the details of the beam-shaping approach used in conventional ELA methods make it extremely difficult to reduce the non-uniformities in the semiconductor films. This is especially because the energy fluence described above may be different for each beam pulse, and thus non-uniformity may be introduced into sections of the semiconductor thin film upon irradiation, solidification and crystallization.

Techniques for fabricating large grained single crystal or polycrystalline silicon thin films using sequential lateral solidification are known in the art. For example, in U.S. Pat. No. 6,322,625 issued to Im and U.S. patent application Ser. No. 09/390,537, the entire disclosures of which are incorporated herein by reference, and which is assigned to the common assignee of the present application, particularly advantageous apparatus and methods for growing large grained polycrystalline or single crystal silicon structures using energy-controllable laser pulses and small-scale translation of a silicon sample to implement sequential lateral solidification have been described. In these patent documents, it has been discussed in great detail that at least portions of the semiconductor film on a substrate are irradiated with a suitable radiation pulse to completely melt such portions of the film throughout their thickness. In this manner, when the molten semiconductor material solidifies, a crystalline structure grows into the solidifying portions from selected areas of the semiconductor film which did not undergo a complete melting. This publication mentions that the small grain growth in regions in which nucleation may occur. As is known in the art, such nucleation generates small grained material in the area of the nucleation.

As was previously known to those having ordinary skill in the art of a sequential lateral solidification ("SLS") as described in U.S. Pat. No. 6,322,625, which utilizes the irradiation of a particular area using beam pulses whose cross-sectional areas are large, it is possible for the nucleation to occur in such areas before a lateral crystal growth is effectuated in such area. This was generally thought to be undesirable, and thus the placement of the TFT devices within these area was avoided.

While certain TFT devices do not require a high performance level, they require good uniformity in certain applications. Accordingly, it may be preferable to generate substrates which include the semiconductor films that allow uniform small-grained material to be produced therein, without the need for a multiple irradiation of the same area on the semiconductor thin film.

SUMMARY OF THE INVENTION

One of the objects of the present invention is to provide an improved process and system to which can produce generally uniform areas on the substrate films such that the TFT devices can be situated in such areas. Another object of the present invention is to allow such areas to be nucleated (based on the threshold behavior of the beam pulse), and then solidified, such that upon re-solidification, the nucleated area becomes a region with uniform small grained material. It is also another object of the present invention to increase the speed to process the semiconductor films for their use with the liquid crystal displays or organic light emitting diode displays. It is still another object of the present invention to allow each irradiated area of the semiconductor thin film to be irradiated once, without the need to re-irradiate a substantial portion thereof, while still providing a good uniform material therein.

In accordance with at least some of these objectives as well as others that will become apparent with reference to the following specification, it has now been determined that the nucleated and small grained material have an extremely good uniformity (e.g., uniform grains). It was also ascertained that the grain size in such nucleated areas does not vary even in a significant manner if the beam pulses melting these areas have fluctuating energy densities. This is particularly the case when the beam's energy density stays above the required threshold for fully melting these areas throughout their thickness. For example, in the case of a semiconductor film which has a thickness of approximately 0.1 µm, the energy density of each beam pulse should be above 50 mJ/cm². Further, the uniformity in the thin film was found to be insensitive to a spatial non-uniformity of the beam incident on the semiconductor film so long as the minimum intensity of the beam is above the above-described threshold.

In one exemplary embodiment of the present invention, a process and system for processing a semiconductor thin film sample are provided. in particular, a beam generator can be controlled to emit at least one beam pulse. With this beam pulse, at least one portion of the film sample is irradiated with sufficient intensity to fully melt such section of the sample throughout its thickness. Such beam pulse may have a predetermined shape. This portion of the film sample is allowed to re-solidify, and the resolidified portion is composed of a first area and a second area. Upon the re-solidification thereof, the first area includes large grains, and the second area has a small-grained region formed through nucleation. The first area surrounds the second area and has a grain structure which is different from a grain structure of the second area. The second area is configured to facilitate thereon an active region of a thin-film transistor ("TFT").

In another exemplary embodiment of the present invention, the first area has a first border and a second border which is provided opposite and parallel to the first border of the first area. Also, the second area has a third border and a fourth border which is provided opposite and parallel to the third border of the second area. A distance between the first border and the second border is smaller than a distance between the third border and the fourth border. The second area preferably corresponds to at least one pixel. In addition, the second area may have a cross-section for facilitating thereon all portions of the TFT. It is also possible for a portion of the first area to contain thereon a small section of the TFT. A size and a position of the first area with respect to the second area can be provided such that there is no effect or a negligible effect on a performance of the TFT by the first area.

According to yet another embodiment of the present invention, the thin film sample can be translated for a predetermined distance. With a further beam pulse, a further portion of the film sample can be irradiated. The further portion is provided at a distance from such portion that substantially corresponds to the predetermined distance. This further portion of the film sample is allowed to re-solidify, the re-solidified portion being composed of a third area and a fourth area. In addition, the third area can surround the fourth area, and at least one section of the third area at least partially overlaps at least one section of the first area. Further, upon the re-solidification thereof, the third area has laterally grown grains, and the fourth area has a nucleated region. The fourth area can also be composed of edges which are provided away from edges of the second area. Furthermore, the fourth area may be composed of edges which are approximately border edges of the second area, and the edges of the fourth area may not necessarily extend into any section of the first area. The beam pulse may have a fluence which is substantially the same as a fluence of the further beam pulse (or different therefrom).

In still another embodiment of the present invention, the thin film sample can be translated for a predetermined distance. Then, a further portion of the film sample can be irradiated using the beam pulse. The further portion is provided at a distance from such portion that substantially corresponds to the predetermined distance. The film sample may be a pre-patterned silicon thin film sample or a continuous silicon thin film sample. In addition, the thin film sample can be translated for a predetermined distance, and a further portion of the film sample may be irradiated using at least one beam pulse. The further portion is preferably provided at a distance from this portion that substantially corresponds to the predetermined distance. In addition, the film sample can be delivered to a first relative pre-calculated position of the further portion of the film sample to be irradiated. After such delivery, the film sample may be provided at a second relative pre-calculated position whose distance is different from the predetermined distance.

According to further embodiment of the present invention, the thin film sample can again be translated for a predetermined distance. Then, the translation of the film sample may be stopped, and vibrations of the film sample to allowed to settle. Thereafter, a further portion of the thin film is irradiated using at least one beam pulse, with the further portion being provided at a distance from such portion that substantially corresponds to the predetermined distance. Then, the portion of the film sample is irradiated with a further beam pulse, and allowed to re-solidify. A fluence of the beam pulse is different from a fluence of the further beam pulse (e.g., less than the fluence of the beam pulse).

According to still further embodiment of the present invention, a location of the first area is determined so as to avoid a placement of the active region of the TFT thereon. The beam pulse preferably includes a plurality of beamlets, and the first and second areas are irradiated by the beamlets. The semiconductor thin film sample may be a silicon thin film sample, and possibly composed of silicon, germanium or an alloy thereof. The semiconductor thin film may have a thickness approximately between 100 Å and 10,000 Å. Portions of the beam pulse can be masked to produce at least one masked beam pulse, such that the masked beam pulse is used to irradiate the portion of the film sample. The large grains provided in the first area may be laterally-grown grains, and the laterally-grown grains of the first area can be equiaxed grains.

According yet another embodiment of the present invention, a semiconductor thin film sample is provided which has a first area and a second area. The first area preferably has large grains therein. The second area is surrounded by the first area and includes a region formed through nucleation of at least one section of the semiconductor thin film in which the second area is situated. The structure of the grains of the first area is different from a structure of the grains of the second area. The second area is preferably configured to facilitate thereon an active region of a thin-film transistor ("TFT").

The accompanying drawings, which are incorporated and constitute part of this disclosure, illustrate a preferred embodiment of the invention and serve to explain the principles of the invention.

BRIEF DESCRIPTION OF THE DRAWINGS

FIG. 2 is a top exploded view of an exemplary embodiment of the sample conceptually subdivided, and having a semiconductor thin film thereon on which a process according to the present invention is performed for the entire surface area a semiconductor thin film using the exemplary system of FIG. 1A;

FIGS. 4A-4D are irradiations, by the radiation beam pulse which is masked by the mask of FIG. 3, and then re-solidifications and crystallizations of the particular portions of the semiconductor film provided on the sample for a first exemplary conceptual column of the sample at various sequential stages of the exemplary embodiment according to the process of the present invention;

FIG. 5A is a top view of a second exemplary embodiment of the mask according to the present invention which has a beam-blocking area surrounding multiple small open or transparent areas or slits, and which can be used with the exemplary system of FIG. 1A to mask the beam pulses generated by a beam source into patterned beamlets, such that such masked beamlet pulses irradiate the particular areas on the semiconductor film;

FIG. 5B is an enlarged view of the beamlets of the second embodiment of the mask illustrated in FIG. 5A;

DETAILED DESCRIPTION

Figure 1A:
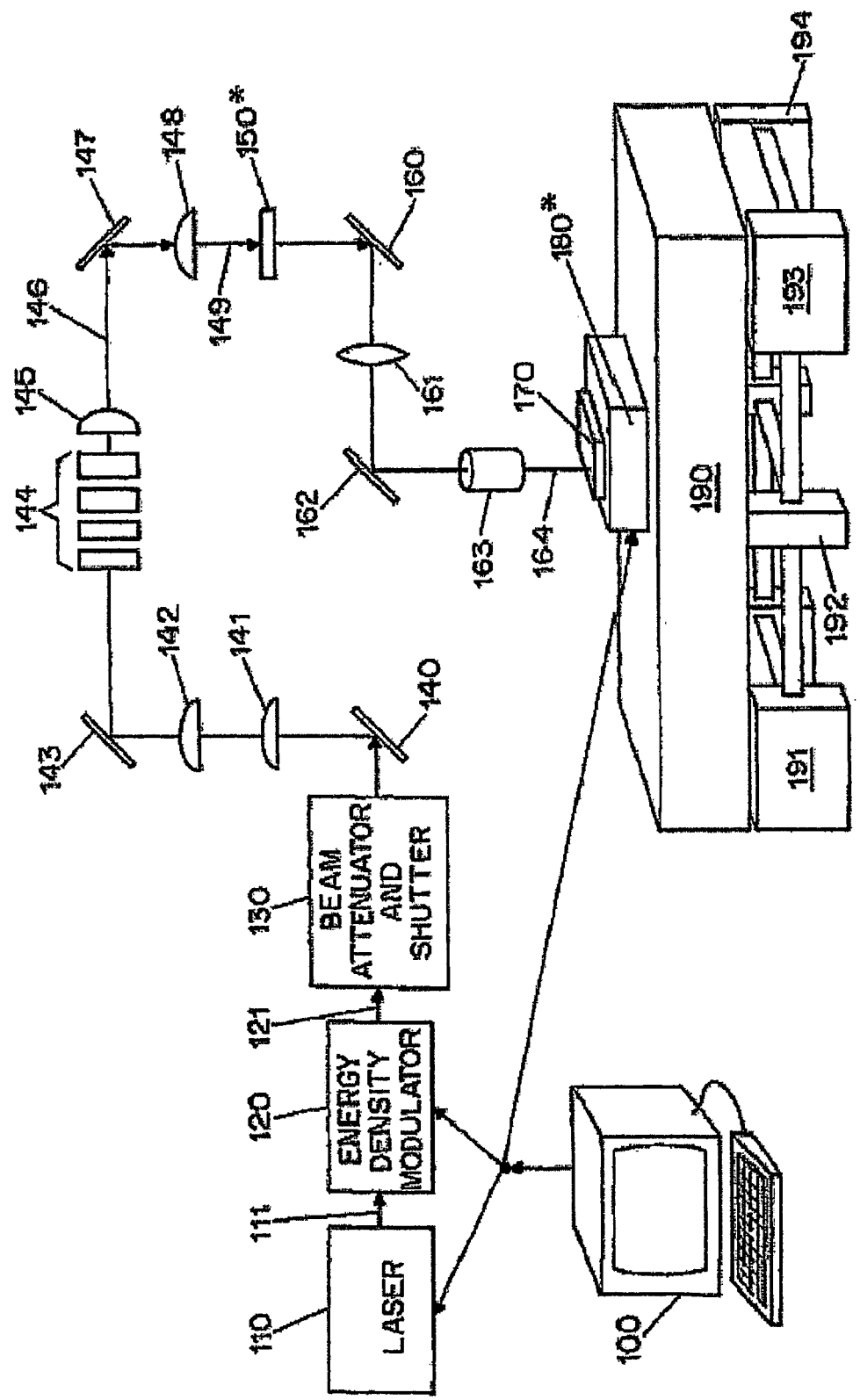
FIG. 1A is a schematic block diagram of an exemplary embodiment of an irradiation system according to the present invention which irradiates particular areas of a semiconductor thin film of a sample so that they nucleate and solidify to produce uniform small grained regions.

It should be understood that various systems according to the present invention can be utilized to generate, nucleate, solidify and crystallize one or more areas on the semiconductor (e.g., silicon) film which have uniform material therein such that at least an active region of a thin-film transistor ("TFT") can be placed in such areas. The exemplary embodiments of the systems and process to achieve such areas, as well as of the resulting crystallized semiconductor thin films shall be described in further detail below. However, it should be understood that the present invention is in no way limited to the exemplary embodiments of the systems, processes and semiconductor thin films described herein.

Certain systems for providing a continuous motion SLS are described in U.S. patent application Ser. No. 09/526,585 (the "'585 application"), the entire disclosure of which is incorporated herein by reference. Substantially solar systems according to the exemplary embodiment of the present invention can be employed to generate the nucleated, solidified and crystallized portions of the semiconductor film described above on which it is possible to situate the active regions of the TFT device. In particular, the system according to the present invention is used on a sample 170 which has an amorphous silicon thin film thereof that is being irradiated by irradiation beam pulses to promote the nucleation, subsequent solidification and crystallization of the particular areas of the semiconductor thin film. The exemplary system includes a beam source 110 (e.g., a Lambda Physik model LPX-315I XeCl pulsed excimer laser) emitting an irradiation beam (e.g., a laser beam), a controllable beam energy density modulator 120 for modifying the energy density of the laser beam, a MicroLas two plate variable attenuator 130, beam steering mirrors 140, 143, 147, 160 and 162, beam expanding and collimating lenses 141 and 142, a beam homogenizer 144, a condenser lens 145, a field lens 148, a projection mask 150 which may be mounted in a translating stage (not shown), a 4×-6× eye piece 161, a controllable shutter 152, a multi-element objective lens 163 for focusing a radiation beam pulse 164 onto the sample 170 having the semiconductor thin film to be processed mounted on a sample translation stage 180, a granite block optical bench 190 supported on a vibration isolation and self-leveling system 191, 192, 193 and 194, and a computing arrangement 100 (e.g., a general purpose computer executing a program according to the present invention or a special-purpose computer) coupled to control the beam source 110, the beam energy density modulator 120, the variable attenuator 130, the shutter 152 and the sample translation stage 180.

The sample translation stage 180 is preferably controlled by the computing arrangement 100 to effectuate translations of the sample 170 in the planar X-Y directions, as well as in the Z direction. In this manner, the computing arrangement 100 controls the relative position of the sample 40 with respect to the irradiation beam pulse 164. The repetition and the energy density of the irradiation beam pulse 164 are also controlled by the computer 100. It should be understood by those skilled in the art that instead of the beam source 110 (e.g., the pulsed excimer laser), the irradiation beam pulse can be generated by another known source of short energy pulses suitable for completely melting throughout their entire thickness selected areas of the semiconductor (e.g., silicon) thin film of the sample 170 in the manner described herein below. Such known source can be a pulsed solid state laser, a chopped continuous wave laser, a pulsed electron beam and a pulsed ion beam, etc. Typically, the radiation beam pulses generated by the beam source 110 provide a beam intensity in the range of 10 mJ/cm$^2$ to 1 J/cm$^2$, a pulse duration (FWHM in the range of 10 to 103 nsec, and a pulse repetition rate in the range of 10 Hz to 104 Hz.

While the computing arrangement 100, in the exemplary embodiment of the system shown in FIG. 1A, controls translations of the sample 170 via the sample stage 180 for carrying out the processing of the semiconductor thin film of the sample 170 according to the present invention, the computing arrangement 100 may also be adapted to control the translations of the mask 150 and/or the beam source 110 mounted in an appropriate mask/laser beam translation stage (not shown for the simplicity of the depiction) to shift the intensity pattern of the irradiation beam pulses 164, with respect to the semiconductor thin film of the sample 170, along a controlled beam path. Another possible way to shift the intensity pattern of the irradiation beam pulse is to have the computer 100 control a beam steering mirror. The exemplary system of FIG. 1 may be used to carry out the processing of the silicon thin film of the sample 170 in the manner described below in further detail. The mask 150 should be used by the exemplary system of the present invention to well define the profile of the resulting masked beam pulse 164 and to reduce the edge regions of the portions of the semiconductor thin film when these portions are irradiated by such masked beam pulse 164 and then crystallized.

Figure 1B:
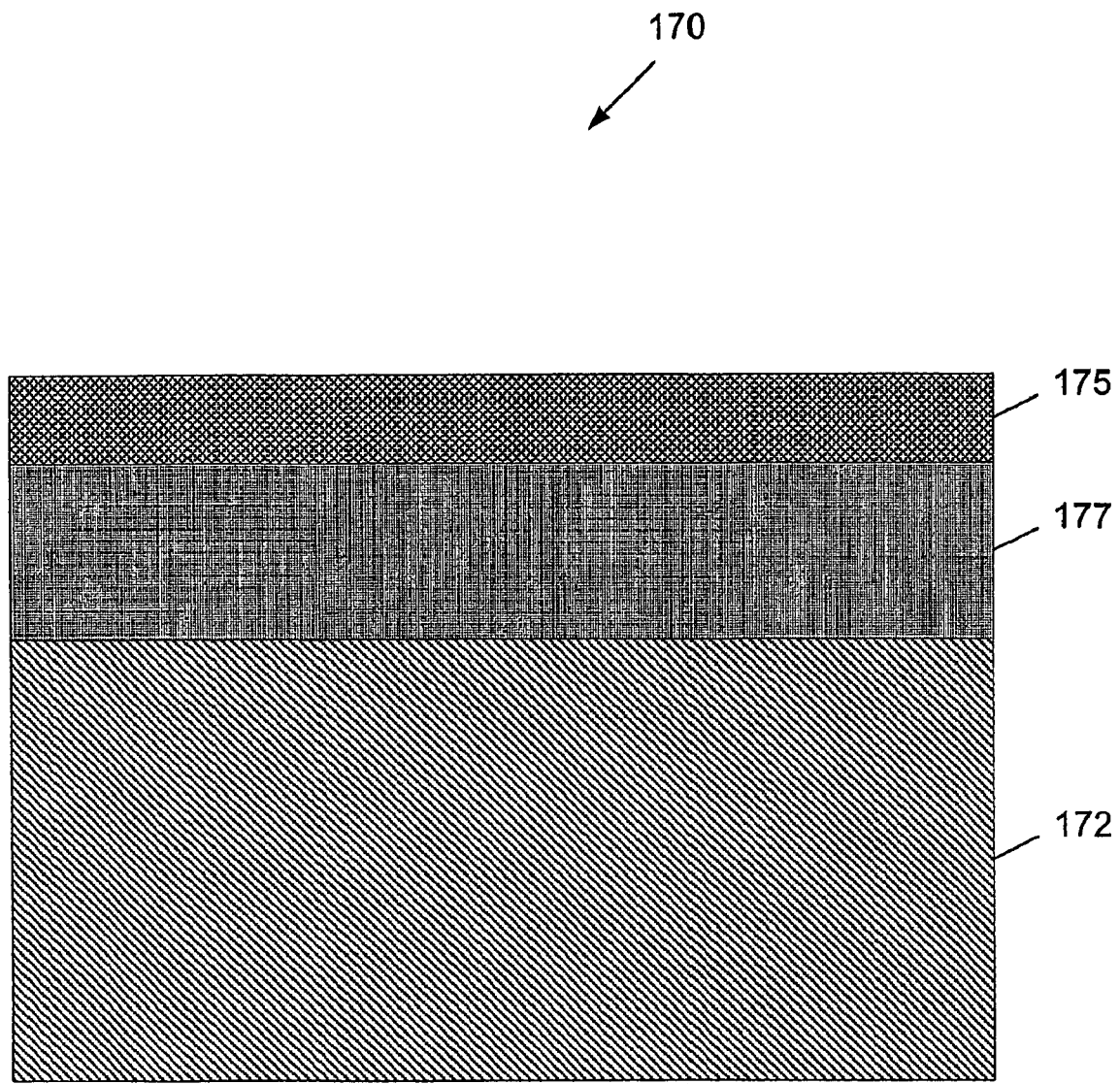
FIG. 1B is an enlarged cross-sectional side view of the sample which includes the semiconductor thin film.

As illustrated in FIG. 1B, the semiconductor thin film 175 of the sample 170 can be directly situated on e.g., a glass substrate 172, and may be provided on one or more intermediate layers 177 there between. The semiconductor thin film 175 can have a thickness between 100 Å and 10,000 Å (1 µm) so long as at least certain necessary areas thereof can be completely melted throughout their entire thickness. According to an exemplary embodiment of the present invention, the semiconductor thin film 175 can be composed of silicon, germanium, silicon germanium (SeGe), all of which preferably have low levels of impurities. It is also possible to utilize other elements or semiconductor materials for the semiconductor thin film 175. The intermediary layer 177, which is situated immediately underneath the semiconductor thin film 175, can be composed of silicon oxide (SiO$_2$), silicon nitride (Si$_3$N$_4$), and/or mixtures of oxide, nitride or other materials that are suitable for promoting nucleation and small grain growth within the designated areas of the semiconductor thin film 175 of the sample 170. The temperature of the glass substrate 172 can be between room temperature and 800° C. Higher temperatures of the glass substrate 172 can be accomplished by preheating the substrate 172 which would effectively allow larger grains to be grown in the nucleated, re-solidified, and then crystallized areas of the semiconductor thin film 175 of the sample 170 due to the proximity of the glass substrate 172 to the thin film 175.

FIG. 2 shows an enlarged view of an exemplary embodiment of the semiconductor thin film 175 (e.g., an amorphous silicon thin film) of the sample 170, and the relative translation paths of the beam pulse 164 with respect to the locations on the sample 170. This exemplary sample 170 has exemplary dimensions of 40 cm in the Y direction by 30 cm in the X direction. The sample 170 can be conceptually subdivided into a number of columns (e.g., a first conceptual column 205, a second conceptual column 206, a third conceptual column 207, etc.). The location/size of each conceptual column may be stored in a storage device of the computing arrangement 100, and utilized by the computing arrangement 100 for later controlling the translation of the sample 170, and/or firing of the beam by the beam source 110 on these locations of the semiconductor thin film 175, or on other locations that are based on the stored locations. Each of the columns 205, 206, 207, etc. is dimensioned, e.g., ½ cm in the Y direction by 30 cm in the X direction. Thus, if the sample 170 is sized 40 cm in the Y direction, the sample 150 may be conceptually subdivided into eighty (80) columns. The sample 170 may also be conceptually subdivided into such columns having other dimensions (e.g., 1 cm by 30 cm columns, 2 cm by 30 cm columns, 2 cm by 30 cm columns, etc.). In fact, there is absolutely no restrictions on the dimensions of the conceptual columns of the sample 170 so long as the beam pulse 164 is capable of irradiating and completely melting certain areas of the semiconductor thin film 175 in such columns so as to promote nucleation, solidification, and small grain growth within such areas for forming uniform areas on the film sample 175 to allow at least the active region of the TFT device to be placed completely therein without a concern of non-uniformity therein. The location/dimension of each column, and the locations thereof, are stored in the storage device of the computing arrangement 100, and utilized by such computing arrangement 100 for controlling the translation of the translation stage 180 with respect to the beam pulse 164 and/or the firing of the beam 111 by the beam source 110.

Figure 3:
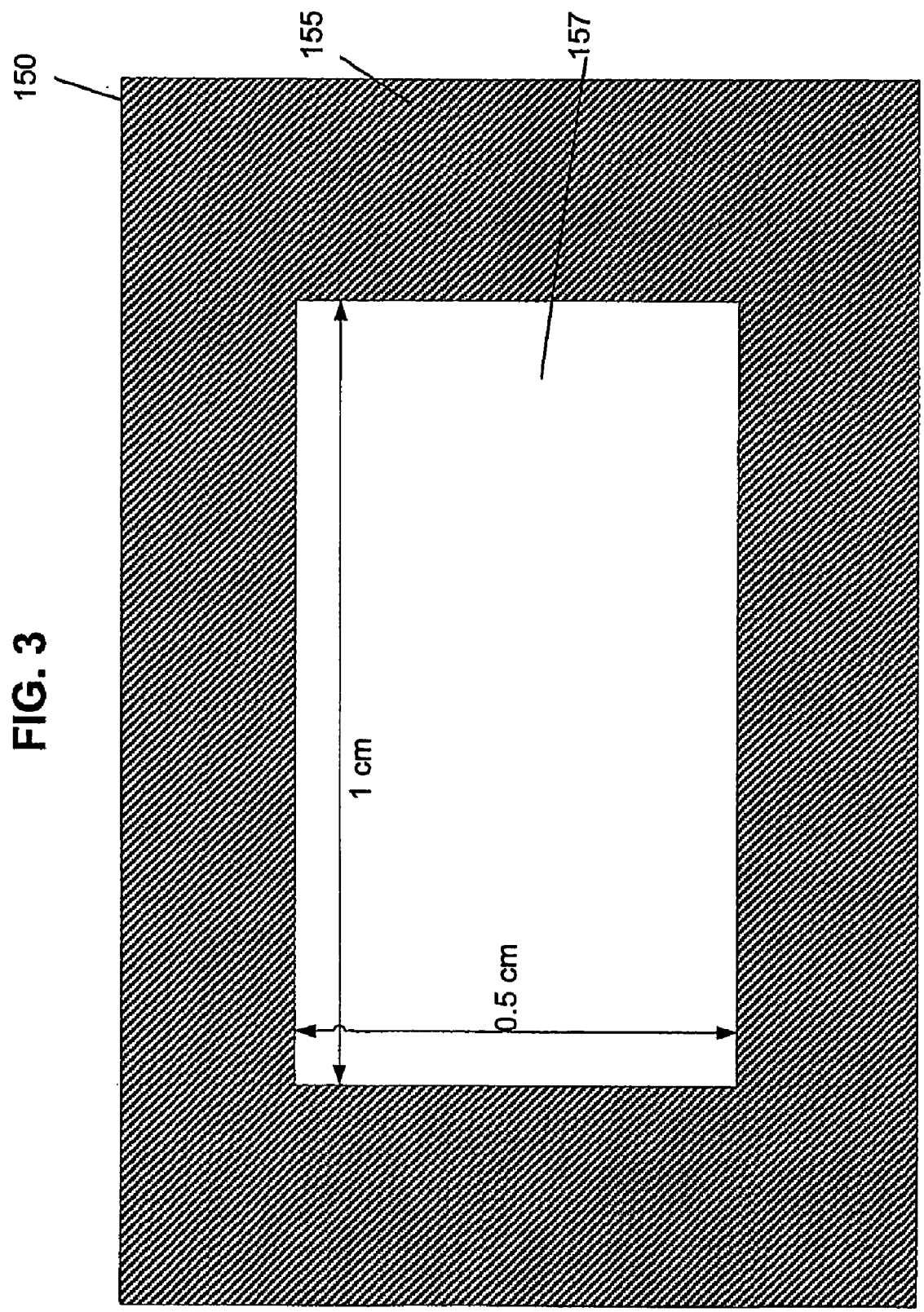
FIG. 3 is a top view of a first exemplary embodiment of a mask according to the present invention which has a beam-blocking area surrounding one open or transparent area, and which can be used with the exemplary system of FIG. 1A to mask the beam pulses generated by a laser beam source into a patterned beam pulse, such that such masked beam pulses irradiate the particular areas on the semiconductor film.

The semiconductor thin film 175 can be irradiated by the beam pulse 164 which is patterned using the mask 150 according to a first exemplary embodiment of the present invention as shown in FIG. 3. The first exemplary mask 150 is sized such that its cross-sectional area is larger than that of the cross-sectional area of the beam pulse 164. In this manner, the mask 150 can pattern the pulsed beam to have a shape and profile directed by the open or transparent regions of the mask 150. In this exemplary embodiment, the mask 150 includes a beam-blocking section 155 and an open or transparent section 157. The beam-blocking section 155 prevents those areas of the pulsed beam impinging such section 155 from being irradiated there-through, thus preventing the further entering the optics of the exemplary system of the present invention shown in FIG. 1A to irradiate the corresponding areas of the semiconductor thin film 175 provided on the sample 170. In contrast, the open or transparent section 157 allows the portion of the beam pulse 164 whose cross-section corresponds to that of the section 157 to enter the optics of the system according to the present invention, and irradiate the corresponding areas of the semiconductor thin film 175. In this manner, the mask 150 is capable of patterning the beam pulse 164 so as to impinge the semiconductor thin film 175 of the sample 170 at predetermined portions thereof as shall be described in further detail below.

A first exemplary embodiment of the process according to the present invention shall now be described with reference to the irradiation of the semiconductor thin film 175 of the sample 170 as illustrated in FIGS. 4A-4F. In this exemplary process of the present invention, the beam 111 is shaped by the exemplary mask 150 of FIG. 3, and the exemplary irradiation and/or impingement of the semiconductor thin film 175 of the sample 170 is shown in FIG. 2. For example, the sample 170 may be translated with respect to the beam pulse 164, either by moving the mask 150 or the sample translation stage 180, in order to irradiate selective areas of the semiconductor thin film 175 of the sample 170. For the purposes of the foregoing, the length and width of the laser beam 149 may be greater than 1 cm in the X-direction by ½ cm in the Y-direction (e.g., a rectangular shape) so that it can be shaped by the mask 150 of FIG. 3. However, it should be understood the pulsed laser beam 149 is not limited to such shape and size. Indeed, other shapes and/or sizes of the laser beam 149 are, of course, achievable as is known to those having ordinary skill in the art (e.g., shapes of a square, triangle, circle, etc.).

After the sample 170 is conceptually subdivided into columns 205, 206, 207, etc., a pulsed laser beam 111 is activated (by actuating the beam source 110 using the computing device 100 or by opening the shutter 130), and produces the pulsed laser beamlets 164 which impinges on a first location 220 which is away from the semiconductor thin film 175. Then, the sample 170 is translated and accelerated in the forward X direction under the control of the computing arrangement 100 to reach a predetermined velocity with respect to the fixed position beamlets in a first beam path 225.

In one exemplary variation of the process of the present invention, the pulsed beamlets 164 can reach a first edge 210' of the sample 170 preferably when the velocity of the movement of the sample 170 with respect to the pulsed laser beam 149 reaches the predetermined velocity. Then, the sample 170 is continuously (i.e., without stopping) translated in the –X direction at the predetermined velocity so that the pulsed beamlets 164 continue irradiating successive portions of the sample 170 for an entire length of a second beam path 230.

After passing the first edge 210', the beam pulse 164 impinges and irradiates a first area 310 of the semiconductor thin film 175, preferably with enough intensity to completely melt such area throughout its thickness, as illustrated in FIG. 4A. Then, as shown in FIG. 4B, this first area 310 is allowed to solidify and crystallize, thereby forming two regions therein—a first small-grained region 315 and a first laterally-grown region 318. The first small-grained region 315 is formed after the nucleation of the large section within the first area 310. The dimensions of this region 315 are slightly smaller that the dimensions of the beam pulse 164 irradiating the first area 310, with the first small-grained region 315 being surrounded by the first laterally-grown region 318 (the details of which are described herein below).

The first laterally-grown region 318 is formed by laterally growing the grains from the borders between the unmelted portions of the semiconductor thin film 175 and the first melted area 310. The grains in the first laterally-grown region 318 grown from these borders toward the center of the first melted area for a predetermined distance, to reach the first small- ed region 315 and form a border there between. This predetermined distance is controlled by the rate of re-solidification of the first melted area 310. For example, the predetermined distance can be between 1 µm and 5 µm. Therefore, the first laterally-grown region 318 is significantly smaller that the first small-grained region 315 which it surrounds. Generally, the grains of the region 315 are smaller than he grains of the region 318. However, the small-grained material in the first small-grained region 315 provides a good uniformity for the placement of the TFT devices, and at least the active regions thereof, in such uniform small-grained region. For the purposes of the present invention, it is undesirable to position the active regions of the TFT devices on such small-grained regions.

Thereafter, as shown in FIG. 4C, the sample 170 is continued to be translated (or the mask 150 is configured to be adjusted) such that the beam pulse 164 irradiates and completely melts (throughout its thickness) a second area 320 of the semiconductor thin film 175. This second area 320 which can be a subsequent area immediately following the first area 320 in the first conceptual column 205 along the +X direction. Similarly to the first area 310, the second area 320 re-solidifies and crystallizes into a second small-grained region 325 and a second laterally-grown region 328, which correspond to the characteristics and dimensions of the first small-grained region 315 and the first laterally-grown region 318, respectively. If, during the irradiation of the second area 320, the beam pulse 164 slightly overlaps the first laterally-grown region 318, then upon re-solidification, the grains in this region 318 seed and laterally grow a portion of the completed melted second area 320 which is immediately adjacent to the first laterally-grown region 318. In this manner, the adjacent section of the second laterally-grown region 328 is seeded by the first laterally-grown region 318 to laterally grow grams therefrom. The resultant crystallized second area 320 is illustrated in FIG. 4D. It is also within the scope of the present invention for the second area 320 to be provided at a distance from the crystallized first area 310. Accordingly, the sections of the second laterally-grown region 328 which is situated closest to the crystallized first laterally-grown region 318 is seeded by the grains from an un-irradiated section between the first area 310 and the second area.

Figure 4E:
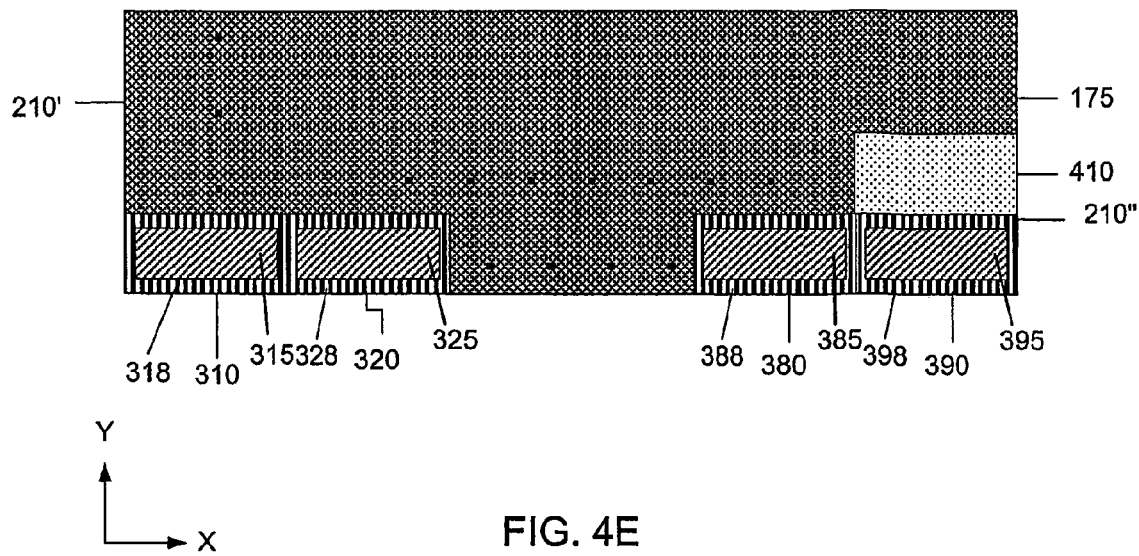
FIGS. 4E-4F are irradiations, by the radiation beam pulse which is masked by the mask of FIG. 3, and then re-solidifications and crystallizations of the particular portions of the semiconductor film provided on the sample for a second exemplary conceptual column of the sample at two exemplary sequential stages of the processing according to the process of the present invention.

The translation and irradiation of the first conceptual column 205 of the semiconductor thin film 175 continues until all areas 310, 320, . . . , 380, 390 (and their respective small-grained regions 315, 325, . . . , 385, 395 and laterally-grown regions 318, 328, . . . , 388, 398) in this first conceptual column 205 is continued until the pulsed beamlets 164 reach a second edge 210" of the sample 170, as illustrated in FIG. 4E. The crystallization of the areas 310, 320, . . . , 380, 390 along the first conceptual column 205 is performed in a substantially repetitive manner. When the beam pulse 164 passes the second edge 210", the translation of the sample 170 may be slowed with respect to the beam pulse 164 (in a third beam path 235) to reach a second location 240 (FIG. 2). It should be noted that it is not necessary to shut down the pulsed beam 111 after the beam pulse 164 has crossed the second edge 210" of the sample 170 because it is no longer irradiating the sample 170.

While being away from the sample 170 and the second edge 210", the sample is translated in a –Y direction to a third location 247 via a fourth beam path 245 so as to be able to irradiate the sections of the semiconductor thin film 175 along the second conceptual column 206. Then, the sample 170 is allowed to settle at that location 247 to allow any vibrations of the sample 170 that may have occurred when the sample 170 was translated to the third location 247 to cease. Indeed, for the sample 170 to reach the second conceptual column 206, it is translated approximately ½ cm for the columns having a width (in the –Y direction) of ½ cm. The sample 170 is then accelerated to the predetermined velocity via a fourth beam path 250 in the –X direction so that the impingement of the semiconductor thin film 175 by the beam pulse 164 reaches, and then bypasses the second edge 210".

Thereafter, the sample 170 is translated along a fifth beam path 255, and the exemplary process described above with respect to the irradiation of the first column 205 may then be repeated for the second conceptual column 206 to irradiate further areas 410, 420, and their respective small-grained regions 415, 425 and laterally-grown regions 418, 428 while translating the sample in the +X direction. In this manner, all conceptual columns of the sample 170 can be properly irradiated. Again, when the beam pulse 164 reaches the first edge 210', the translation of the sample 170 is decelerated along a sixth beam path 260 to reach a fourth location 265. At that point, the sample 170 is translated in the −Y direction along the seven beam path 270 for the beam pulse to be outside the periphery of the sample 170 to reach fifth location 272, and the translation of the sample 170 is allowed to be stopped so as to remove any vibrations from the sample 170. Thereafter, the sample 170 is accelerated along the eighth beam path 275 in the −X direction so that the beam pulse 164 reaches and passes the first edge 210' of the sample 170, and the beam pulse 164 irradiates and completely melts certain areas in the third conceptual column 207 so that they can crystallize in substantially the same manner as described above for the areas 310, 320, . . . , 380, 390 of the first conceptual column 205 and the areas 410, 420, . . . of the second conceptual column 206.

This procedure may be repeated for all conceptual columns of the semiconductor thin film 175, for selective columns of particular sections of the thin film 175 which are not necessarily conceptually subdivided into columns. In addition, it is possible for the computing arrangement 100 to control the firing of the beam 111 by the beam source 110 based on the predefined location stored in the storage device of the computing arrangement 100 (e.g., instead of irradiating the semiconductor thin film 175 by setting predetermined pulse durations). For example, the computing arrangement 100 can control the beams source 110 to generate the beam 111 and irradiate only at the predetermined locations of certain areas of the thin film 175 with its corresponding beam pulse 164, such that these locations are stored and used by the computing arrangement 100 to initiate the firing of the beam 111 which results in the irradiation by the beam pulse only when the sample 170 is translated to situate those areas directly in the path of the beam pulse 164. The beam source 110 can be fired via the computing arrangement 100 based on the coordinates of the location in the X direction.

In addition, it is possible to translate the sample 170 in a manner which is not necessary continuous, when the path of the irradiation of the beam pulse 164 points to the areas on the semiconductor thin film 175 to be melted and crystallized. Thus, it is possible for the translation of the sample 170 to be stopped in the middle of the sample 170, with the area in the middle being irradiated, completely melted, and then re-solidified and crystallized. Thereafter, the sample 170 can be moved so that another section of the semiconductor thin film 175 is arranged in the path of the beam pulse 164, such that the translation of the sample is then stopped again and the particular section is irradiated and completely melted in accordance with the exemplary embodiment of the process described in great detail above, as well as the embodiments of the process which shall be described below.

According to the present invention, any mask described and shown herein and those described and illustrated in the '535 application may be used for the process and system according to the present invention. For example, instead of using the mask shown in FIG. 3 which allows the semiconductor thin film 175 to be flood-irradiated, a second exemplary embodiment of the mask 150' illustrated in FIG. 5A can be utilized. In contrast to the mask 150 of FIG. 3 which has a single open or transparent region 157, the mask 150' has multiple open or transparent regions 450 which are separated from one another by beam-blocking regions 455. The open or transparent regions 450 of the mask 150' can also be referred to as "slits." These slits permit small beam pulses (or beamlets) to irradiate there-through and completely melt the areas of the semiconductor thin film 175 that they impinge. An enlarged illustration of one of the slits 450 is provided in FIG. 5B, which shows that the dimensions of the slits 450 can be 0.5 µm by 0.5 µm. It should be clearly understood that other dimensions of the slits are possible, and are within the scope of the present invention. For example, the slits can have a rectangular shape, a circular shape, a triangular shape, a chevron shape, a diamond shape, etc.

FIGS. 6A-6D show an exemplary progression of a second embodiment of the process according to the present invention in which a plurality of successive areas along the first conceptual column 205 of the semiconductor thin film 175 is irradiated by the beam pulse 164 (comprised of beamlets) which is shaped by the mask 150' of FIG. 5A. The translation of the sample 170 with sect to the impingement thereof by the beam pulse 164 is substantially the same as the translation described above with reference to FIGS. 4A-4F. The difference between the irradiation of the areas 310, 320, . . . , 380, 390, 410, 420 by the beam pulse 164 shaped by the mask 150 of FIG. 3 and the areas 460, 470 by the beam pulse 164 shaped by the mask 150' is that substantially the entire areas 310, 320, . . . , 380, 390, 410, 420 are irradiated and completely melted, as opposed to only certain small portions 462 of the areas 460, 470 are irradiated and completely melted throughout their entire thickness.

Figure 6A:
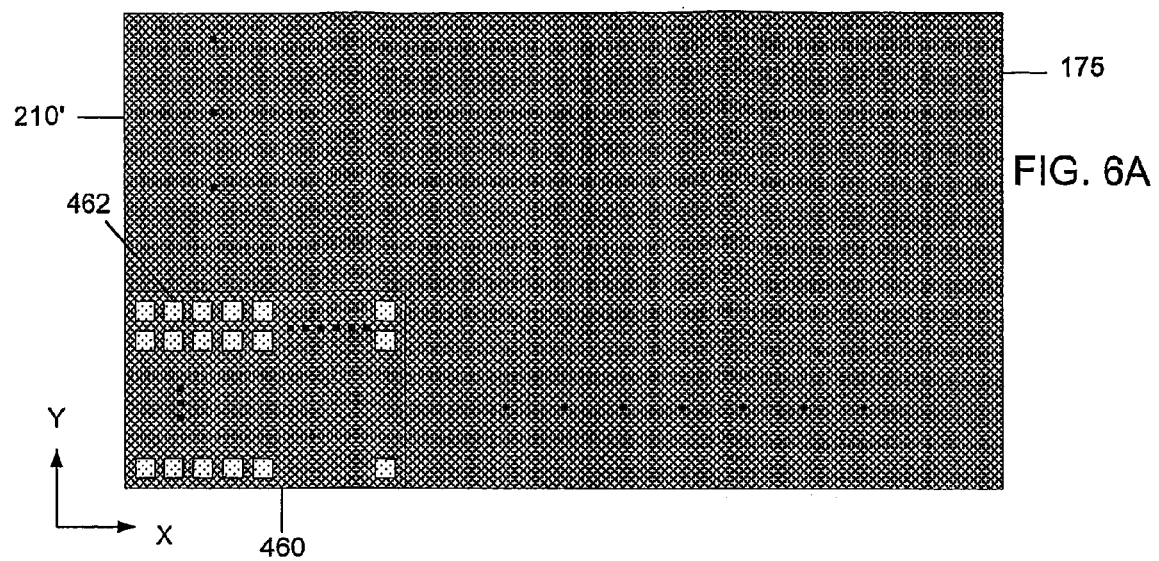
FIGS. 6A-6D are irradiations, by the radiation beam pulse intensity pattern which is masked by the mask of FIG. 5, and then re-solidifications and crystallizations of the particular portions of the semiconductor film provided on the sample for the first exemplary conceptual column of the sample at various sequential stages of the first exemplary embodiment of the exemplary embodiment according to the process of the present invention.
Figure 6B:
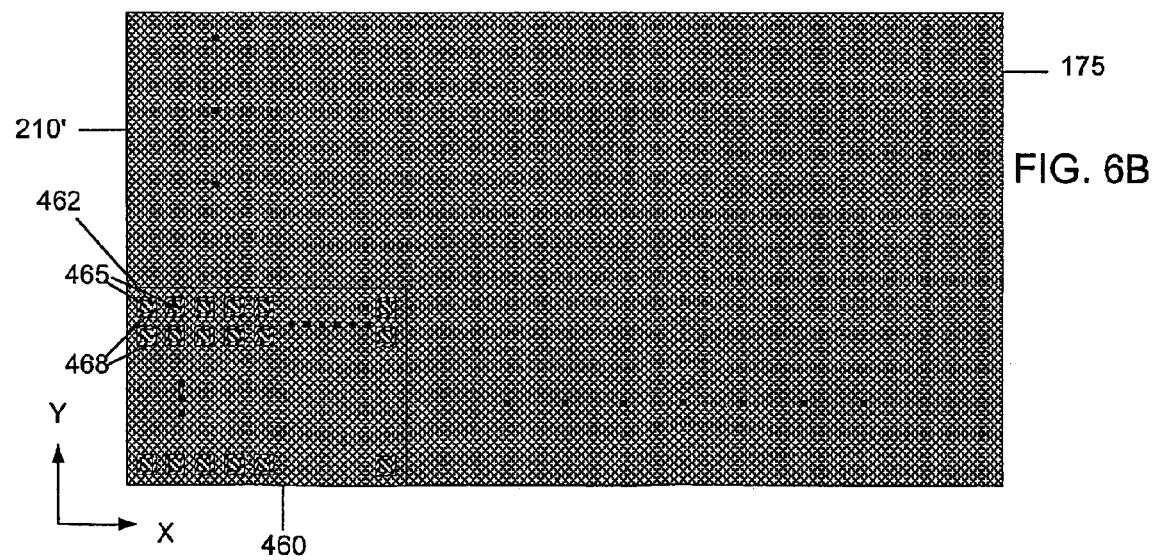
Figure 6C:
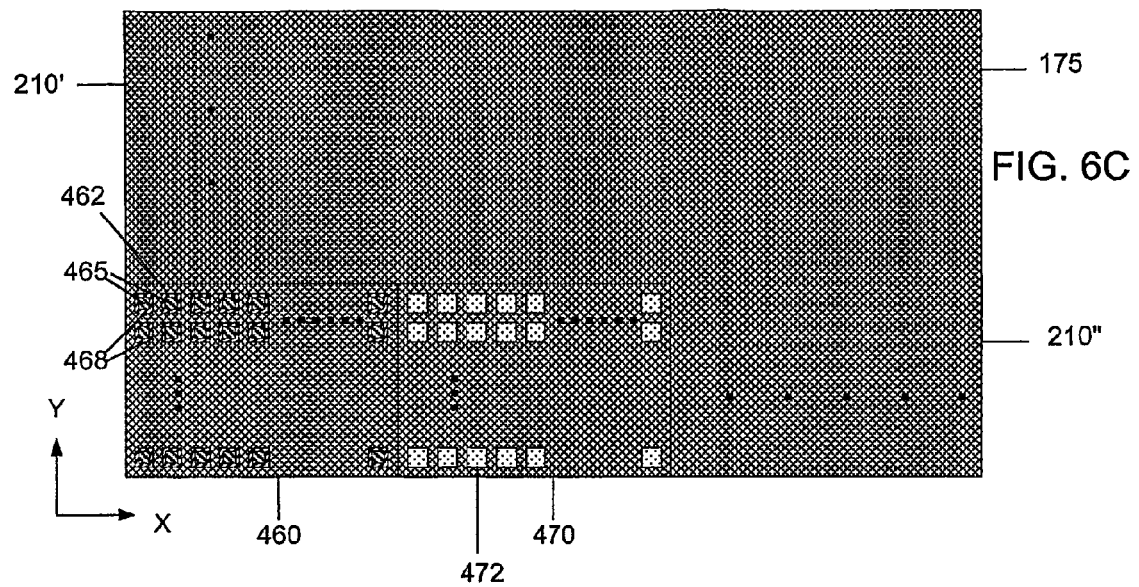

Similarly to the area 310 in FIG. 4A, the portions 462 of the area 460 are irradiated and completely melted as illustrated in FIG. 6A. Thereafter, the portions 462 are re-solidified to form the small-grained regions 465 (due to nucleation), and the laterally grown regions 468 as shown in FIG. 4B. Similarly to the first small-grained regions 315, the small-grained regions 465 of the respective portions 462 have small grain uniform materials therein, and are sized such that at least an active region of the TFT device (and possible the entire TFT device) can be placed within each such region 465. The small grain uniform material of the region 465 is formed due to the nucleation and re-solidification of this region. As shown in FIG. 6C, upon the translation of the sample 170 in the −X direction, portions 472 of the area 470 are irradiated and completely melted in a substantially the same manner as the portions 462. In such manner, the small-grained regions 475 and the laterally-grown regions 478 of the area 470 are formed.

Figure 7:
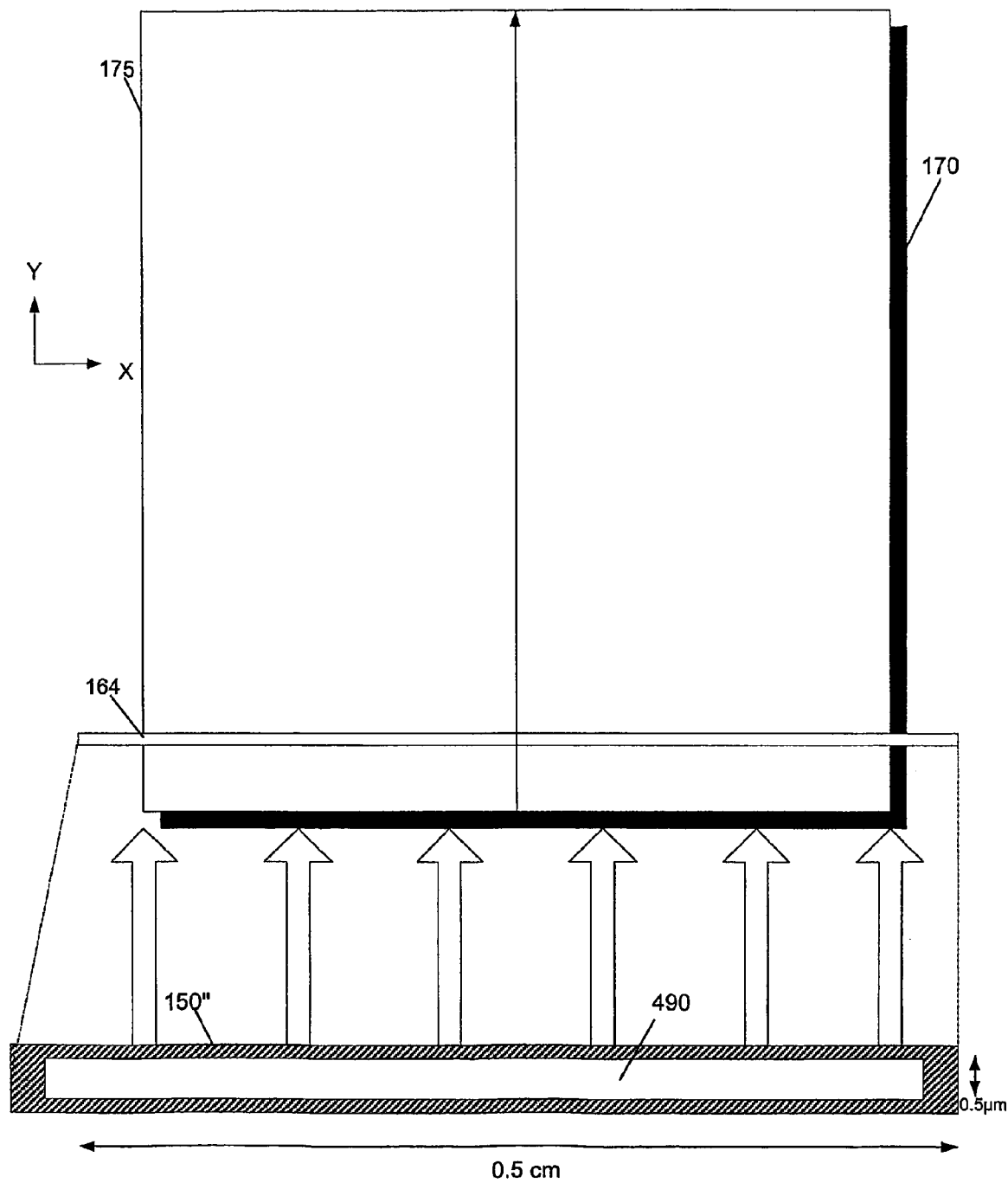
FIG. 7 is an illustration of the semiconductor thin film provided on the sample, and such thin film being irradiated by the beam pulse having a cross-section that is patterned by a mask having a beam-blocking area surrounding one long and narrow open or transparent area, and which can be used with the exemplary system of FIG. 1A.

In addition, it is possible to utilize a third embodiment of a mask 150" according to the present invention as shown in FIG. 7 which has a long and narrow open or transparent region 490 so as to pattern and shape the beam 149 into the beam pulse 164. For example, the length of the region 490 can be 0.5 cm and the width thereof may be 0.1 mm. In this manner, each conceptual column of the sample 170 illustrated in FIG. 2 can be irradiated by the beam pulse 164 shaped by this mask 150". In addition, it may be possible for the length of the region 490 to be 30 cm. Thus, instead of subdividing the semiconductor thin film 175 into a number of conceptual columns, and irradiating each column separately, it is possible to irradiate and completely melt selected portions of the semiconductor thin film 175 by translating the sample 170 in the −Y direction from one edge of the sample 170 to the opposite edge thereof. It is important that the small-grained uniform regions be formed using such processing technique such that it would be possible to situate the active regions of the respective TFT devices thereon.

Figure 6D:
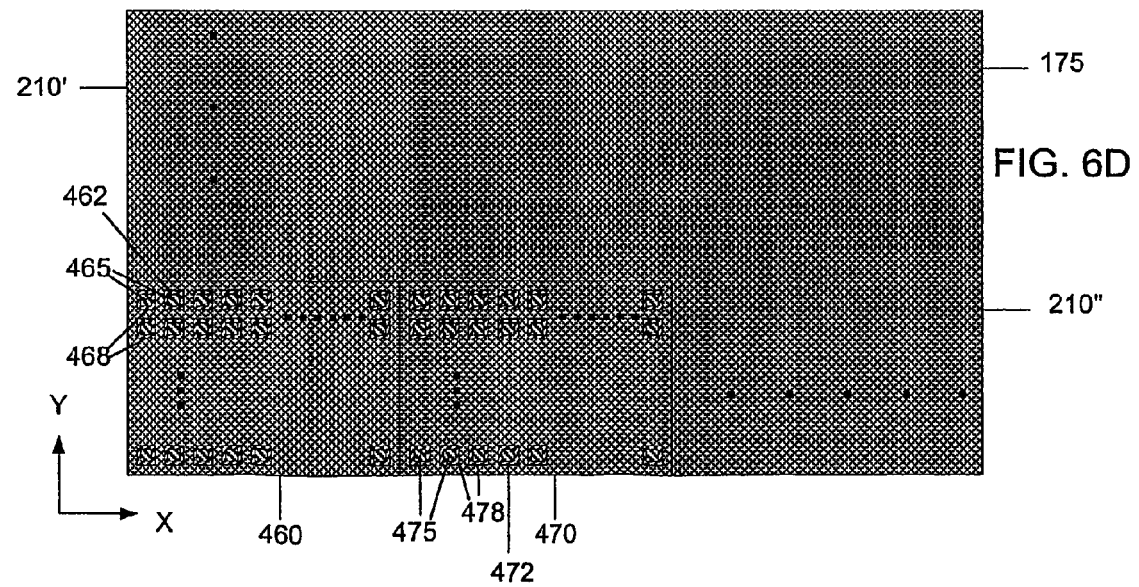
Figure 8A:
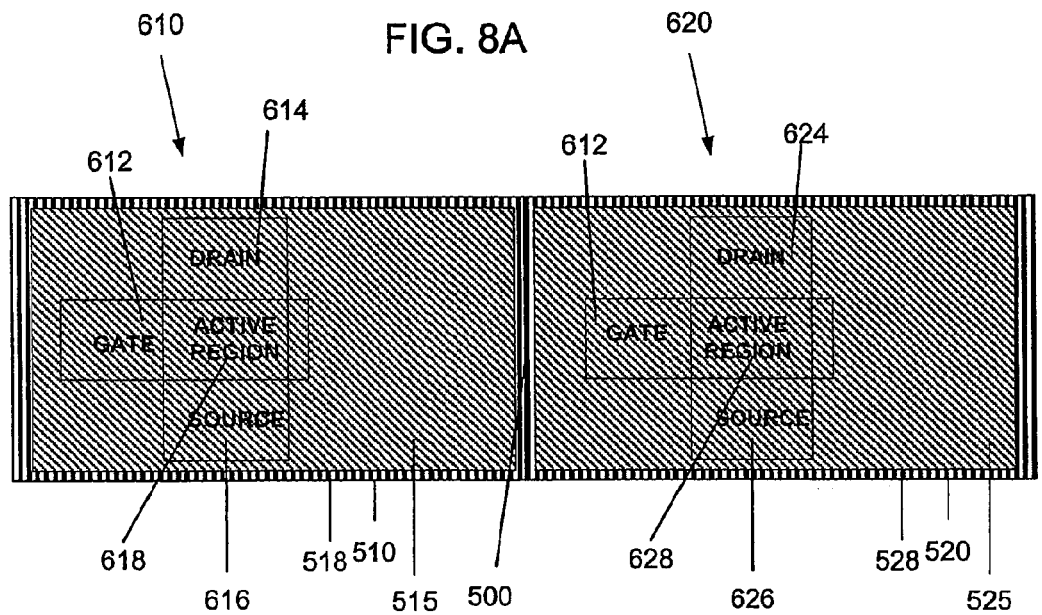
FIG. 8A is an illustration of the two particular areas irradiated, re-solidified and crystallized areas corresponding to the areas of FIGS. 4D and 6D in which the entire TFT device is situated in the small uniformed grained region formed through nucleation.

FIG. 8A shows an illustration of the first and second irradiated, re-solidified and crystallized areas 510 and 520 possibly corresponding to the first and second areas 310, 320 of FIGS. 4D and/or the adjacent portions 462 of the area 460 of FIG. 6D. In particular, FIG. 8A shows that the entire TFT devices 610, 620 can be situated within the respective uniform small-grained regions 515, 525 of the areas 510, 520. The first TFT device 610 situated in the small-grained region 515 of the area 510 includes a gate 612, a drain 614, a source 616 and an active region 618, all of which are provided away from the laterally-grown region 518. Similarly, for the second TFT device 610, its gate 622, drain 624, source 626, and especially active region 628 are also situated that they do not overlap the respective laterally-grown region 528 of the area 520.

Figure 8B:
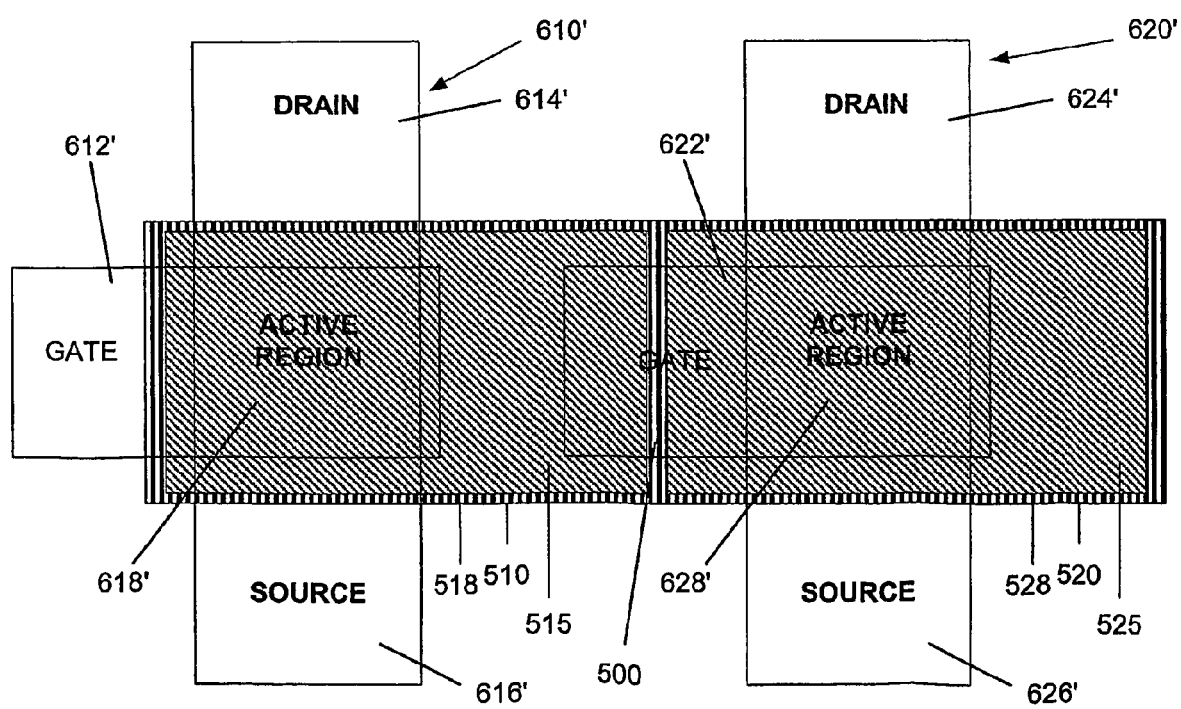
FIG. 8B is an illustration of the two particular areas irradiated, re-solidified and crystallized areas corresponding to the areas of FIGS. 4D and 6D in which only the entire cross-section of the active region of the TFT device is situated in the small uniformed grained region formed through nucleation, while other regions are provided over border areas between the crystallized areas.

FIG. 8B shows an illustration of the first and second irradiated, re-solidified and crystallized areas 510 and 520 also possibly corresponding to the adjacent portions 462 of the area 460 of FIG. 6D with the respective TFT devices 610', 620' provided thereon. In this exemplary embodiment, only respective active regions 618', 628' of the areas 510, 520 are provided within the respective uniform small-grained regions 515, 525 of the areas 510, 520, while other portions of the TFT devices 610', 620' are situated on the respective laterally-grown regions 518, 528 of the areas 510, 520. In particular, the first TFT device 610' includes an active region 618' which entirely situated in the small-grained region 515 of the area 510, while a gate 612', a drain 614' and a source 616' of this TFT device 610' overlap the laterally-grown region 518. Also, for the second TFT device 610', an active region 628' thereof is entirely situated within the respective small-grained region 525 of the area 520, while a gate 622', a drain 624' and a source 626' of the second TFT device 620' are provided directly on the respective laterally-grown regions 528 of the area 520. Also, the gate 622', is provided on a border region 500 between the small-grained region 515 of the area 510 and the small-grained region 525 of the area 520. It should be understood that any one of the gate 612, 612', 622, 622', drain 614, 614', 624, 624' and source 616, 616', 626, 626' can be provided on the laterally-grown regions 518, 528 and the border region 500. In addition, according to still another embodiment of the present invention, it is possible to situate a small portion of the active regions 618', 628' of the respective TFT devices 610', 620' on the border region 500 or the laterally-grown regions 518, 528, while still having the major portions of these active regions 618', 628' provided within the small-grained regions 515, 525.

Figure 9:
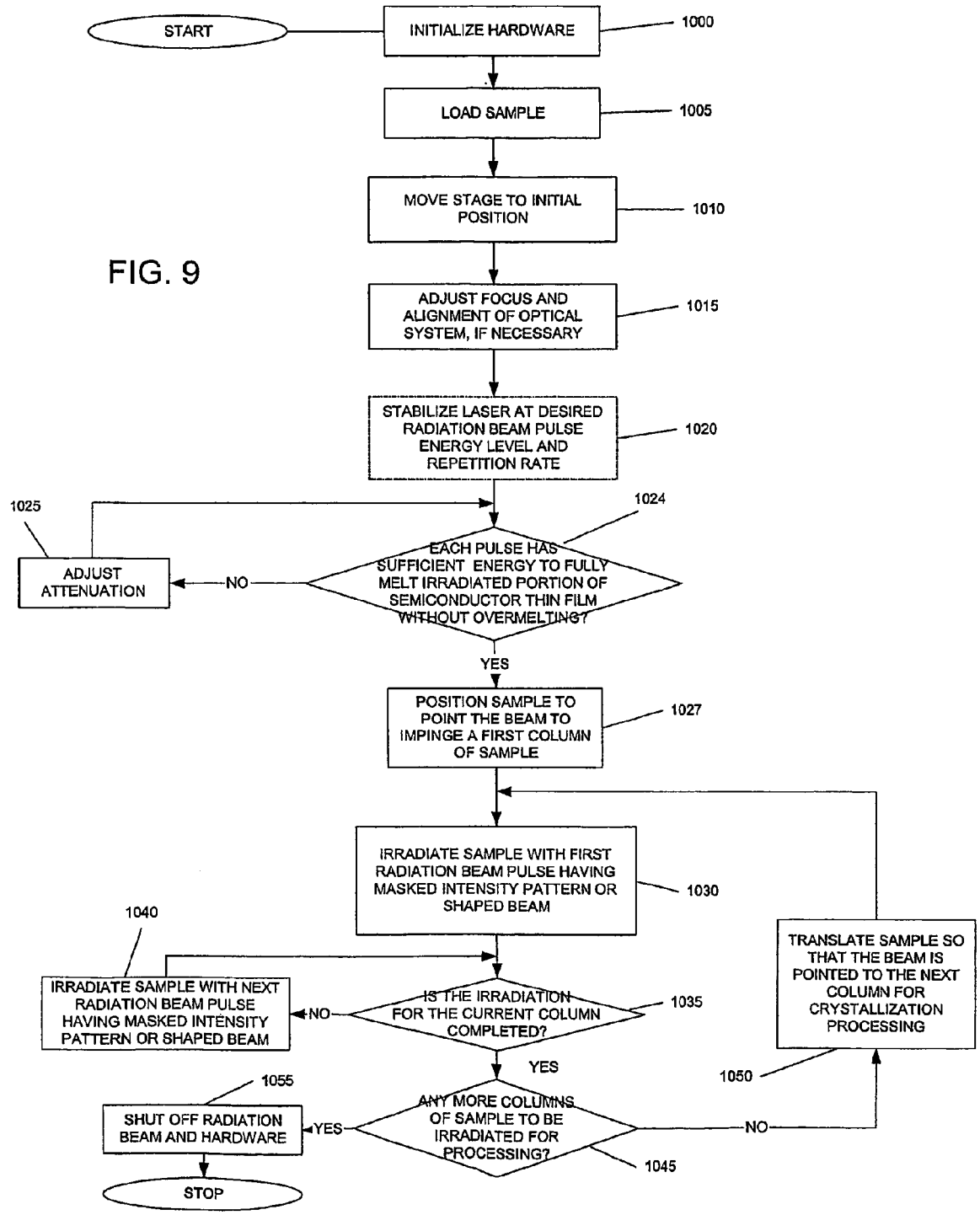
FIG. 9 is a flow diagram representing an exemplary processing procedure of the present invention under at last partial control of a computing arrangement of FIG. 1A using the exemplary techniques of the present invention of FIGS. 4A-4F and 6A-6D.

FIG. 9 show a flow diagram representing a first exemplary processing procedure of the present invention under at least a partial control of a computing arrangement of FIG. 1A which uses the techniques of the present invention of FIGS. 4A-4F and 6A-6D. In step 1000, the hardware components of the system of FIG. 1A, such as the beam source 110, the energy beam modulator 120, and the beam attenuator and shutter 130 are first initialized at least in part by the computing arrangement 100. The sample 170 is loaded onto the sample translation stage 180 in step 1005. It should be noted that such loading may be performed either manually or automatically using known sample loading apparatus under the control of the computing arrangement 100. Next, the sample translation stage 180 is moved, preferably under the control of the computing arrangement 100, to an initial position in step 1010. Various other optical components of the system are adjusted and/or aligned either manually or under the control of the computing arrangement 100 for a proper focus and alignment in step 1015, if necessary. In step 1020, the irradiation/laser beam 111 is stabilized at a predetermined pulse energy level, pulse duration and repetition rate. In step 1024, it is preferably determined whether each beam pulse 164 has sufficient energy to fully melt the irradiated portions of the semiconductor thin film 175 without over-melting them. If that is not the case, the attenuation of the beam 111 is adjusted by the beams source 110 under the control of the computing arrangement 100 in step 1025, and step 1024 is executed again to determine if the there is sufficient energy to melt the portions of the semiconductor thin film.

In step 1027, the sample 170 is positioned to point the beam pulse 164 to impinge the first column of the semiconductor thin film. Then, in step 1030, the portions of the semiconductor thin film are irradiated and filly melted throughout their entire thickness using a masked intensity pattern or a shaped beam pulse (e.g., using the mask 150 or merely shaping the beam). Thereafter, the irradiated portions of the semiconductor thin film are allowed to solidify and crystallize such that the certain areas of the solidified portions have been nucleated and include uniform material therein so as to allow at least the active regions of the TFT devices to be placed entirely therein. In step 1035, it is determined whether the irradiation for the current conceptual column by the beam pulse has been completed. If no, in step 1045, the sample is continued to be irradiated with the next beam pulse 164. However, if in step 1035, it is determined that the irradiation and crystallization of the current conceptual column is completed, then it is determined in step 1045 whether there are any further conceptual columns of the sample 170 to be processed. If so, the process continues to step 1050 in which the sample 170 is translated to that the beam pulse 164 is pointed to the next conceptual column to be processed according to the present invention. Otherwise, in step 1055, the exemplary processing has been completed for the sample 170, and the hardware components and the beam 111 of the system shown in FIG. 1A can be shut off, and the process is terminated.

Figure 10:
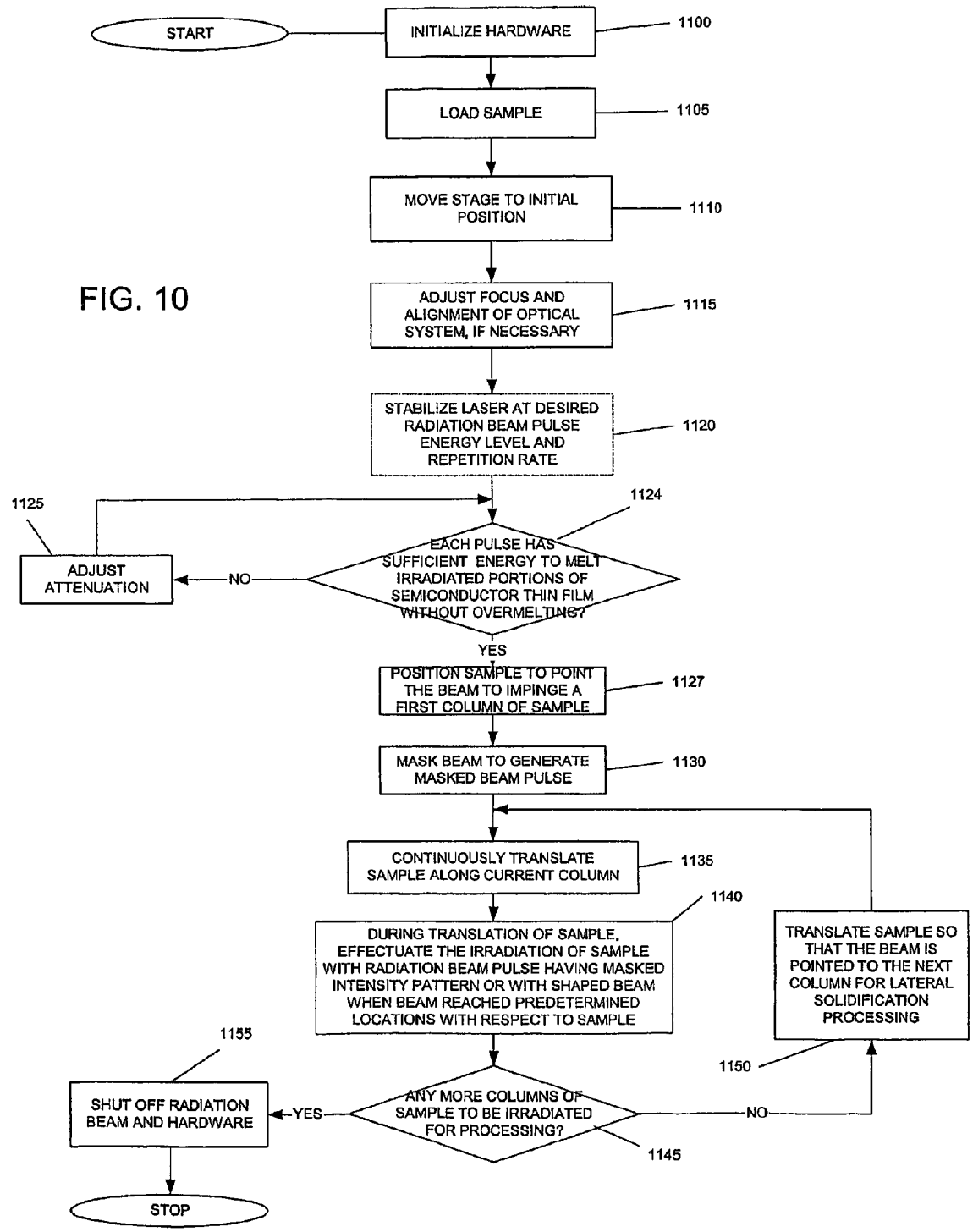
FIG. 10 is a flow diagram representing another exemplary processing procedure of the present invention under at least partial control of a computing arrangement of FIG. 1A using the exemplary techniques of the present invention of FIGS. 4A-4F and 6A-6D, and in which the beam source of FIG. 1A is triggered based on the positions of the semiconductor film with respect to the impingement of the beam.

FIG. 10 shows a flow diagram representing a second exemplary processing procedure of the present invention under at least a partial control of a computing arrangement of FIG. 1A using the techniques of the present invention of FIGS. 4A-4F and 6A-6D, in which it is preferable to irradiate the sample 170 based on preassigned locations on the semiconductor thin film 175. Steps 1100-1120 of this exemplary procedure are substantially the same as the steps 1000-1020 of the procedure of FIG. 9, and thus shall not be described herein in further detail. In step 1024, however, it is determined whether each beam 111 has enough energy to irradiate at least portions of the semiconductor thin film 175 such that the irradiated portion crystallize. If not, in step 1125, the attenuation for the beam pulse is adjusted, and the energy fluence is verified again. Upon the verification of the energy fluence of the beam pulse, the sample is moved to impinge a first column of the sample 170.

Then, in step 1130, the resultant beam 149 is passed through the mask 159 to shape the beam pulse, and shape the edge portions of the resultant pulse. Then, the sample 170 is continuously translated along the current column in step 1135. In step 1140, during the translation of the sample 170, the portions of the semiconductor thin film 175 are irradiated, and fully melted throughout their entire thickness, e.g., using a masked intensity pattern beam pulse to allow the irradiated portions to be crystallized. This irradiation of the portions of the semiconductor thin film 175 can be performed when the beam pulses 164 reach particular locations on the sample 170, which are pre-assigned by the computing arrangement 100 and stored in the storage device thereof. Thus, the beam source 110 can be fired upon the sample 170 reaching these locations with respect to the beam pulses 164. Thereafter, the irradiated portions of the semiconductor thin film 175 are allowed to solidify and crystallize such that the certain areas of the solidified portions have been nucleated, and include the uniform material therein so as to allow the active regions of the TFT devices to be placed thereon. Such processing is continued until the end of the current conceptual column on the semiconductor thin film 175 (e.g., the edge of the sample 170) is reached. In step 1145, it is determined whether there are any further conceptual columns of the sample 170 are to be processed. If so, the process continues to step 1150 in which the sample is translated so that the beam pulse 164 is pointed to the next conceptual column to be processed according to the present invention. Otherwise, in step 1155 is performed, which is substantially the same as that of step 1055 of FIG. 9.

The foregoing merely illustrates the principles of the invention. Various modifications and alterations to the described embodiments will be apparent to those skilled in the art in view of the teachings herein. For example, while the above embodiment has been described with respect to at least partial lateral solidification and crystalization of the semiconductor thin film, it may apply to other materials processing techniques, such as micro-machining, photo-ablation, and micro-patterning techniques, including those described in International patent application no. PCT/US01/12799 and U.S. patent application Ser. Nos. 09/390,535, 09/390,537 and 09/526,585, the entire disclosures of which are incorporated herein by reference. The various mask patterns and intensity beam patterns described in the above-referenced patent application can also be utilized with the process and system of the present invention. It should also be understood that while the systems and processes described above are directed for processing, e.g., semiconductor thin films, these techniques and systems can also be used to process other films, including metal thin films, etc.

It will thus be appreciated that those skilled in the art will be able to devise numerous systems and methods which, although not explicitly shown or described herein, embody the principles of the invention and are thus within the spirit and scope of the present invention.

What is claimed is:

1. A method for processing a thin film sample, comprising the steps of:
    (a) controlling a beam generator to emit at least one beam pulse;
    (b) with the at least one beam pulse, irradiating at least one portion of the film sample with sufficient intensity to fully melt the at least one section of the sample throughout its thickness; and
    (c) allowing the at least one portion of the film sample to re-solidify, the re-solidified at least one portion being composed of a first area and a second area, wherein, upon the re-solidification thereof, the first area includes large grains, and the second area has a small-grained region formed through nucleation,
    wherein the first area surrounds the second area and has a grain structure which is different from a grain structure of the second area, and wherein the second area is configured to facilitate thereon an active region of an electronic device.

2. The method according to claim 1,
    wherein the first area has a first border and a second border which is provided opposite and parallel to the first border of the first area,
    wherein the second area has a third border and a fourth border which is provided opposite and parallel to the third border of the second area, and
    wherein a distance between the first border and the second border is smaller than a distance between the third border and the fourth border.

3. The method according to claim 2, wherein the second area corresponds to at least one pixel.

4. The method according to claim 1, wherein the second area has a cross-section for facilitating thereon all portions of the electronic device.

5. The method according to claim 1, wherein a size and a position of the first area with respect to the second area are provided such that the first area provides either no effect or a negligible effect on a performance of the electronic device.

6. The method according to claim 1, further comprising the steps of:
    (d) translating the thin film sample for a predetermined distance;
    (e) with a further beam pulse, irradiating a further portion of the film sample, wherein the further portion is provided at a distance from the at least one portion that substantially corresponds to the predetermined distance; and
    (f) allowing the further portion of the film sample to re-solidify, the re-solidified at least one portion being composed of a third area and a fourth area,
    wherein the third area surrounds the fourth area, and wherein at least one section of the third area at least partially overlaps at least one section of the first area, and
    wherein, upon the re-solidification thereof, the third area has laterally grown grains, and the fourth area has a nucleated region.

7. The method according to claim 6, wherein the fourth area is composed of edges which are provided away from edges of the second area.

8. The method according to claim 6, wherein the fourth area is composed of edges which approximately border edges of the second area, and wherein the edges of the fourth area do not extend into any section of the first area.

9. The method according to claim 6, wherein the at least one beam pulse has a fluence which is substantially the same as a fluence of the further beam pulse.

10. The method according to claim 6, wherein the at least one beam pulse has a fluence which is different from a fluence of the further beam pulse.

11. The method according to claim 1, further comprising the steps of:
    (g) translating the thin film sample for a predetermined distance; and
    (h) irradiating a further portion of the film sample using at least one beam pulse, wherein the further portion is provided at a distance from the at least one portion that substantially corresponds to the predetermined distance, and wherein steps (d) and (e) are provided to control a width of the first area.

12. The method according to claim 1, wherein the film sample is one of a pre-patterned silicon thin film sample and a continuous silicon thin film sample.

13. The method according to claim 1, wherein the electronic device is a thin film transistor.

14. The method according to claim 1, further comprising the steps of:
   (i) translating the thin film sample for a predetermined distance;
   (j) irradiating a further portion of the film sample using at least one beam pulse, wherein the further portion is provided at a distance from the at least one portion that substantially corresponds to the predetermined distance; and
   (k) repeating steps (i) and (j) for additional portions of the film sample without stopping the translation of the film sample after the completion of the repeated step (j).

15. The method according to claim 14, wherein step (i) delivers the film sample to a first relative pre-calculated position of the further portion of the film sample to be irradiated, and wherein, after step (k), the film sample is provided at a second relative pre-calculated position whose distance is different from the predetermined distance.

16. The method according to claim 1, further comprising the steps of:
   (l) translating the thin film sample for a predetermined distance;
   (m) stopping the translation of the film sample, and allowing vibrations of the film sample to settle; and
   (n) after step (m), irradiating a further portion of the thin film using at least one beam pulse, wherein the further portion is provided at a distance from the at least one portion that substantially corresponds to the predetermined distance.

17. The method according to claim 1, further comprising the steps of:
   (o) after step (c), irradiating the at least one portion of the film sample with a further beam pulse; and
   (p) after step (o), allowing the at least one portion of the film sample to re-solidify.

18. The method according to claim 17, wherein a fluence of the at least one beam pulse is different from a fluence of the further beam pulse.

19. The method according to claim 18, wherein the fluence of the further beam pulse is less than the fluence of the at least one beam pulse.

20. The method according to claim 1, further comprising the step of:
   (a) after step (c), determining a location of the first area so as to avoid a placement of the active region of the electronic device thereon.

21. The method according to claim 1, wherein the at least one beam pulse includes a plurality of beamlets, and wherein the first and second areas are irradiated by the beamlets.

22. The method according to claim 1, wherein the film sample is one of a silicon thin film sample and a metal thin film sample.

23. The method according to claim 1, wherein the thin film sample is composed of at least one of silicon, germanium, and a compound of silicon germanium.

24. The method according to claim 1, wherein the thin film has a thickness approximately between 100 Å and 10,000 Å.

25. The method according to claim 1, further comprising the step of:
   (r) before step (b), masking portions of the at least one beam pulse to produce at least one masked beam pulse, wherein the at least one masked beam pulse is used to irradiate the at least one portion of the film sample in step (b).

26. The method according to claim 1, wherein the large grains provided in the first area are laterally-grown grains.

27. The method according to claim 26, wherein the laterally-grown grains of the first area are equiaxed grains.

28. A method for processing a thin film sample, comprising the steps of:
   (a) controlling a beam generator to emit at least one beam pulse;
   (b) with the at least one beam pulse, irradiating at least one portion of the film sample with an intensity that is sufficient to fully melt at least one section of the film sample throughout its thickness, the at least one beam pulse having a predetermined shape;
   (c) allowing the at least one portion of the film sample to re-solidify, the re-solidified at least one portion being composed of a first area and a second area, wherein the first area surrounds the second area, and wherein, upon the re-solidification thereof, the first area has large grains, and the second area has a small-grained region formed through nucleation;
   (d) translating the thin film sample for a predetermined distance; and
   (e) irradiating a further portion of the thin film using a further beam pulse, wherein the further portion is provided at a distance from the at least one portion that substantially corresponds to the predetermined distance, wherein steps (b) though (e) are provided to control a width of the first area, and wherein the second area has a cross-section to allow an active region of an electronic device to be facilitated thereon.

29. The method according to claim 28, wherein the second area corresponds to at least one pixel.

30. The method according to claim 28,
   wherein the first area has a first border and a second border which is provided opposite and parallel to the first border of the first area,
   wherein the second area has a third border and a fourth border which is provided opposite and parallel to the third border of the second area, and
   wherein a distance between the first border and the second border is smaller than a distance between the third border and the fourth border.

31. The method according to claim 28, wherein the second area has a cross-section for facilitating thereon all portions of the electronic device.

32. The method according to claim 28, wherein a size and a position of the first area with respect to the second area are provided such that the first area provides either no effect or a negligible effect on a performance of the electronic device.

33. The method according to claim 28, further comprising the steps of:
   (f) after step (e), allowing the further portion of the film sample to re-solidify, the re-solidified at least one portion being composed of a third area and a fourth area,
   wherein the third area surrounds the fourth area, and wherein at least one section of the third area at least partially overlaps at least one section of the first area, and
   wherein, upon the re-solidification thereof, the third area has laterally grown grains, and the fourth area has a nucleated region.

34. The method according to claim 33, wherein the fourth area is composed of edges which are provided away from edges of the second area.

35. The method according to claim 33, wherein the fourth area is composed of edges which approximately border edges of the second area, and wherein the edges of the fourth area do not extend into any section of the first area.

36. The method according to claim 28, wherein the at least one beam pulse has a fluence which is substantially the same as a fluence of the further beam pulse.

37. The method according to claim 28, wherein the at least one beam pulse has a fluence which is different from a fluence of the further beam pulse.

38. The method according to claim 28, wherein the film sample is one of a pre-patterned silicon thin film sample and a continuous silicon thin film sample.

39. The method according to claim 28, wherein the electronic device is a thin film transistor.

40. The method according to claim 28, further comprising the steps of:
   (g) repeating steps (d) and (e) on additional portions of the film sample without stopping the translation of the film sample.

41. The method according to claim 40, wherein step (d) delivers the film sample to a first relative pre-calculated position of the further portion of the film sample to be irradiated, and wherein, after step (e), the film sample is provided at a second relative pre-calculated position whose distance is different from the predetermined distance.

42. The method according to claim 28, further comprising the steps of:
   (h) after step (d), stopping the translation of the film sample, and allowing vibrations of the film sample to settle; and
   (i) after step (h), irradiating a further portion of the thin film using at least one beam pulse, wherein the further portion is provided at a distance from the at least one portion that substantially corresponds to the predetermined distance.

43. The method according to claim 42, wherein a fluence of the at least one beam pulse is different from a fluence of the further beam pulse.

44. The method according to claim 43, wherein the fluence of the further beam pulse is less than the fluence of the at least one beam pulse.

45. The method according to claim 28, wherein the at least one beam pulse includes a plurality of beamlets, and wherein the first and second areas are irradiated by the beamlets.

46. The method according to claim 28, wherein the film sample is one of a silicon thin film sample and a metal thin film sample.

47. The method according to claim 28, wherein the thin film sample is composed of at least one of silicon, germanium, and a compound of silicon germanium.

48. The method according to claim 28, wherein the thin film has a thickness approximately between 100 Å and 10,000 Å.

49. The method according to claim 28, further comprising the step of:
   (j) before step (b), masking portions of the at least one beam pulse to produce at least one masked beam pulse, wherein the at least one masked beam pulse is used to irradiate the at least one portion of the film sample in step (b).

50. The method according to claim 28, wherein the large grains provided in the first area are laterally-grown grains.

51. The method according to claim 50, wherein the laterally-grown grains of the first area are equiaxed grains.

52. A system for processing a thin film sample, comprising:
   a processing arrangement which is configured to:
   (a) control a beam generator to emit at least one beam pulse which is sufficient to fully melt at least one section of the film sample throughout its thickness,
   (b) control a translation stage such that at least one portion of the film sample is irradiated with the at least one beam pulse, the at least one beam pulse having a predetermined cross section,
   wherein the at least one portion of the film sample is allowed to re-solidify, the re-solidified at least one portion being composed of a first area and a second area,
   wherein, upon the re-solidification thereof, the first area has large grains, and the second area has a small-grained region formed through nucleation,
   wherein the first area surrounds the second area and has a grain structure which is different from a grain structure of the second area, and
   wherein the second area is configured to facilitate thereon an active region of an electronic device.

53. The system according to claim 52, wherein the second area corresponds to at least one pixel.

54. The system according to claim 52,
   wherein the first area has a first border and a second border which is provided opposite and parallel to the first border of the first area,
   wherein the second area has a third border and a fourth border which is provided opposite and parallel to the third border of the second area, and
   wherein a distance between the first border and the second border is smaller than a distance between the third border and the fourth border.

55. The system according to claim 52, wherein the second area has a cross-section for facilitating thereon all portions of the electronic device.

56. The system according to claim 52, wherein a size and a position of the first area with respect to the second area are provided such that the first area provides either no effect or a negligible effect on a performance of the electronic device.

57. The system according to claim 52, wherein the processing arrangement is further configured to:
   (c) control the translation stage to translate the thin film sample for a predetermined distance, and
   (d) control the laser beam generator to irradiating a further portion of the film sample with a further beam pulse, the further portion being provided at a distance from the at least one portion that substantially corresponds to the predetermined distance,
   wherein the further portion of the film sample is allowed to re-solidify, the re-solidified at least one portion being composed of a third area and a fourth area,
   wherein the third area surrounds the fourth area, and wherein at least one section of the third area at least partially overlaps at least one section of the first area, and
   wherein, upon the re-solidification thereof, the third area has laterally grown grains, and the fourth area has a nucleated region.

58. The system according to claim 57, wherein the fourth area is composed of edges which are provided away from edges of the second area.

59. The system according to claim 57, wherein the fourth area is composed of edges which approximately border edges of the second area, and wherein the edges of the fourth area do not extend into any section of the first area.

60. The system according to claim 52, wherein the at least one beam pulse has a fluence which is substantially the same as a fluence of the further beam pulse.

61. The system according to claim 52, wherein the at least one beam pulse has a fluence which is different from a fluence of the further beam pulse.

62. The system according to claim 52, wherein the processing arrangement is further configured to:
(e) control the translation stage to translate the thin film sample for a predetermined distance, and
(f) control the laser beam generator to irradiate a further portion of the film sample using at least one beam pulse, wherein the further portion is provided at a distance from the at least one portion that substantially corresponds to the predetermined distance, and wherein the processing arrangement irradiates the at least one portion and allows the at least one portion to re-solidify to control a width of the first area.

63. The system according to claim 52, wherein the film sample is one of a pre-patterned silicon thin film sample and a continuous silicon thin film sample.

64. The system according to claim 52, wherein the electronic device is a thin film transistor.

65. The system according to claim 52, wherein the processing arrangement is further configured to:
(g) control the translation stage to translate the thin film sample for a predetermined distance,
(h) control the laser beam generator to irradiate a further portion of the film sample using at least one beam pulse, wherein the further portion is provided at a distance from the at least one portion that substantially corresponds to the predetermined distance; and
(i) repeat procedures (g) and (h) for additional portions of the film sample without stopping the translation of the film sample after the completion of the repeated procedure (i).

66. The system according to claim 65, wherein the processing arrangement performs procedure (g) to deliver the film sample to a first relative pre-calculated position of the further portion of the film sample to be irradiated, and wherein, after the processing arrangement performs procedure (i), the film sample is provided at a second relative pre-calculated position whose distance is different from the predetermined distance.

67. The system according to claim 52, wherein the processing arrangement is further configured to:
(j) control the translation stage to translate the thin film sample for a predetermined distance, stop the translation of the film sample, and allow vibrations of the film sample to settle, and
(k) after procedure (j), control the laser beam generator to irradiate a further portion of the thin film using at least one beam pulse, wherein the further portion is provided at a distance from the at least one portion that substantially corresponds to the predetermined distance.

68. The system according to claim 52, wherein the processing arrangement is further configured to:
(l) after procedure (b), control the laser beam generator to irradiate the at least one portion of the film sample with a further beam pulse, and
(m) after procedure (l), allow the at least one portion of the film sample to re-solidify.

69. The system according to claim 68, wherein a fluence of the at least one beam pulse is different from a fluence of the further beam pulse.

70. The system according to claim 69, wherein the fluence of the further beam pulse is less than the fluence of the at least one beam pulse.

71. The system according to claim 52, wherein the at least one beam pulse includes a plurality of beamlets, and wherein the first and second areas are irradiated by the beamlets.

72. The system according to claim 52, wherein the film sample is one of a silicon thin film sample and a metal thin film sample.

73. The system according to claim 52, wherein the thin film sample is composed of at least one of silicon, germanium, and a compound of silicon germanium.

74. The system according to claim 52, wherein the thin film has a thickness approximately between 100 Å and 10,000 Å.

75. The system according to claim 52, wherein the processing arrangement is further configured to:
(l) during procedure (b), mask portions of the at least one beam pulse to produce at least one masked beam pulse, wherein the at least one masked beam pulse is used to irradiate the at least one portion of the film sample in procedure (b).

76. The system according to claim 52, wherein the large grains provided in the first area are laterally-grown grains.

77. The system according to claim 76, wherein the laterally-grown grains of the first area are equiaxed grains.

78. A system for processing a thin film sample, comprising:
a processing arrangement which is configured to:
(a) control a beam generator to emit at least one beam pulse which has an intensity which is sufficient to fully melt at least one section of the film sample throughout its entire thickness,
(b) control a translation stage such that at least one portion of the film sample is irradiated with the at least one beam pulse, the at least one beam pulse having a predetermined cross section, wherein the at least one portion of the film sample is allowed to re-solidify, the re-solidified at least one position being composed of a first area and a second area, and wherein, upon the re-solidification thereof, the first area has large grains, and the second area has a small-grained region formed through nucleation,
(c) control the translation stage to translate the thin film sample for a predetermined distance, and
(d) control the laser beam generator to irradiate a further portion of the thin film using a further beam pulse, the further portion being provided at a distance from the at least one portion that substantially corresponds to the predetermined distance,
wherein procedures (b) through (d) are provided to control a width of the first area, and
wherein a width of the second area is configured to facilitate thereon an active region of an electronic device.

79. The system according to claim 78, wherein the second area corresponds to at least one pixel.

80. The system according to claim 78,
wherein the first area has a first border and a second border which is provided opposite and parallel to the first border of the first area,
wherein the second area has a third border and a fourth border which is provided opposite and parallel to the third border of the second area, and
wherein a distance between the first border and the second border is smaller than a distance between the third border and the fourth border.

81. The system according to claim 80, wherein, upon the re-solidification of the film sample, a nucleated region is formed in the second area.

82. The system according to claim 78, wherein the second area has a cross-section for facilitating thereon all portions of the electronic device.

83. The system according to claim 78, wherein a size and a position of the first area with respect to the second area are provided such that the first area provides either no effect or a negligible effect on a performance of the electronic device.

84. The system according to claim 78,
wherein the further portion of the film sample is allowed to re-solidify, the re-solidified at least one portion being composed of a third area and a fourth area, and wherein the third area surrounds the fourth area,
wherein at least one section of the third area at least partially overlaps at least one section of the first area, and
wherein, upon the re-solidification thereof, the third area has laterally grown grains, and the fourth area has a nucleated region.

85. The system according to claim 84, wherein the fourth area is composed of edges which are provided away from edges of the second area.

86. The system according to claim 84, wherein the fourth area is composed of edges which approximately border edges of the second area, and wherein the edges of the fourth area do not extend into any section of the first area.

87. The system according to claim 78, wherein the at least one beam pulse has a fluence which is substantially the same as a fluence of the further beam pulse.

88. The system according to claim 78, wherein the at least one beam pulse has a fluence which is different from a fluence of the further beam pulse.

89. The system according to claim 78, wherein the film sample is one of a pre-patterned silicon thin film sample and a continuous silicon thin film sample.

90. The system according to claim 78, wherein the electronic device is a thin film transistor.

91. The system according to claim 78, wherein the processing arrangement is further configured to:
(e) repeat procedures (c) and (d) on additional portions of the film sample without stopping the translation of the film sample.

92. The system according to claim 78, wherein procedure (c) delivers the film sample to a first relative pre-calculated position of the further portion of the film sample to be irradiated, and wherein, after procedure (d), the film sample is provided at a second relative pre-calculated position whose distance is different from the predetermined distance.

93. The system according to claim 78, wherein the processing arrangement is further configured to:
(f) after procedure (e), control the translation stage to stop the translation of the film sample, and allow vibrations of the film sample to settle, and
(g) after procedure (f), control the laser beam generator to irradiate a further portion of the thin film using at least one beam pulse, wherein the further portion is provided at a distance from the at least one portion that substantially corresponds to the predetermined distance.

94. The system according to claim 93, wherein a fluence of the at least one beam pulse is different from a fluence of the further beam pulse.

95. The system according to claim 93, wherein the fluence of the further beam pulse is less than the fluence of the at least one beam pulse.

96. The system according to claim 78, wherein the at least one beam pulse includes a plurality of beamlets, and wherein the first and second areas are irradiated by the beamlets.

97. The system according to claim 78, wherein the film sample is one of a silicon thin film sample and a metal thin film sample.

98. The system according to claim 78, wherein the thin film sample is composed of at least one of silicon, germanium, and a compound of silicon germanium.

99. The system according to claim 78, wherein the thin film has a thickness approximately between 100 Å and 10,000 Å.

100. The system according to claim 78, wherein the processing arrangement is further configured to:
(l) during procedure (b), mask portions of the at least one beam pulse to produce at least one masked beam pulse, wherein the at least one masked beam pulse is used to irradiate the at least one portion of the film sample in procedure (b).

101. The system according to claim 78, wherein the large grains provided in the first area are laterally-grown grains.

102. The system according to claim 101, wherein the laterally-grown grains of the first area are equiaxed grains.

103. A thin film sample, comprising:
at least one section irradiated by at least one beam pulse which fully melts the at least one section of the sample throughout its thickness,
wherein the at least one portion of the film sample is re-solidified to include a first area and a second area,
wherein, upon the re-solidification of the at least one section, the first area includes large grains, and the second area includes a region formed through nucleation,
wherein the first area surrounds the second area and has a grain structure which is different from a grain structure of the second area, and
wherein the second area is configured to facilitate thereon an active region of an electronic device.

104. A thin film sample, comprising:
a first area having large grains; and
a second area being surrounded by the first area and including a region formed through nucleation of at least one section of the thin film in which the second area is situated,
wherein the first area has a grain structure which is different from a grain structure of the second area, and
wherein the second area is configured to facilitate thereon an active region of an electronic device.

* * * * *

UNITED STATES PATENT AND TRADEMARK OFFICE
CERTIFICATE OF CORRECTION

PATENT NO. : 7,259,081 B2
APPLICATION NO. : 10/525288
DATED : August 21, 2007
INVENTOR(S) : James S. Im It is certified that error appears in the above-identified patent and that said Letters Patent is hereby corrected as shown below:

At column 3, line 14: "sample are provided, in particular, a beam generator can be" should read -- sample are provided. In particular, a beam generator can be --

Figure 4F:
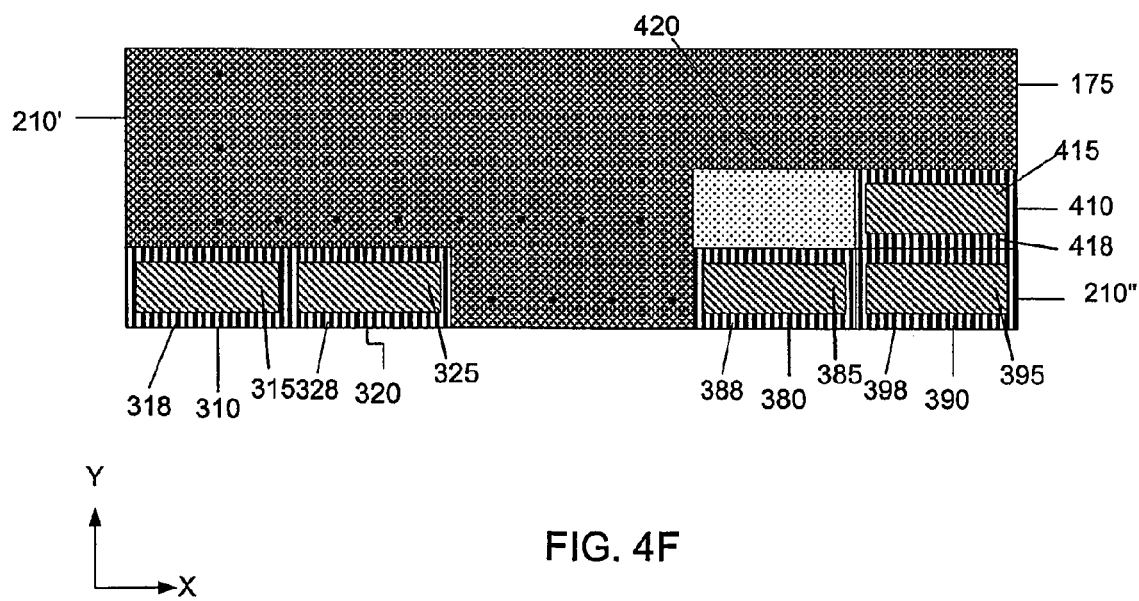

At column 5, line 22: "FIGS. 4E-4F are iradiations, by the radiation beam pulse" should read -- FIGS. 4E-4F are irradiations, by the radiation beam pulse --

At column 5, line 67: "processing procedure of the present invention under at last" should read -- processing procedure of the present invention under at least --

At column 6, line 30: "incorporated herein by reference. Substantially solar sys-" should read -- incorporated herein by reference. Substantially similar sys- --

At column 7, line 14: "beam intensity in the range of 10 mJ/cm2 to 1 J/cm2, a pulse" should read -- beam intensity in the range of 10 mJ/cm2 to 1J/cm2, a pulse --

At column 7, line 15: "duration (FWHM in the range of 10 to 103 nsec, and a pulse" should read -- duration (FWHM) in the range of 10 to 103 nsec, and a pulse --

At column 8, line 61: "150 is capable of pattering the beam pulse 164 so as to" should read -- 150 is capable of patterning the beam pulse 164 so as to --

At column 9, line 60: "the first small- ed region 315 and form a border there" should read -- the first small-grained region 315 and form a border there --

At column 9, line 67: "are smaller than he grains of the region 318. However, the" should read -- are smaller than the grains of the region 318. However, the --

At column 10, line 28: "to laterally grow grams therefrom. The resultant crystallized" should read -- to laterally grow grains therefrom. The resultant crystallized --

At column 10, line 54: "170 because it is no longer iradiating the sample 170." should read -- 170 because it is no longer irradiating the sample 170. --

UNITED STATES PATENT AND TRADEMARK OFFICE
CERTIFICATE OF CORRECTION

PATENT NO. : 7,259,081 B2
APPLICATION NO. : 10/525288
DATED : August 21, 2007
INVENTOR(S) : James S. Im It is certified that error appears in the above-identified patent and that said Letters Patent is hereby corrected as shown below:

At column 12, line 27: "tion of the sample 170 with sect to the impingement thereof" should read -- tion of the sample 170 with respect to the impingement thereof --

At column 14, line 22: "semiconductor thin film are irradiated and filly melted" should read -- semiconductor thin film are irradiated and fully melted --

At column 15, line 31: "least partial lateral solidification and crystalization of the" should read -- least partial lateral solidification and crystallization of the --

Signed and Sealed this

Seventeenth Day of March, 2009

JOHN DOLL
*Acting Director of the United States Patent and Trademark Office*